(12) United States Patent
Grebs et al.

(10) Patent No.: US 8,148,749 B2
(45) Date of Patent: Apr. 3, 2012

(54) TRENCH-SHIELDED SEMICONDUCTOR DEVICE

(75) Inventors: Thomas E. Grebs, Mountaintop, PA (US); Mark Rinehimer, Mountaintop, PA (US); Joseph Yedinak, Mountaintop, PA (US); Dean E. Probst, West Jordan, UT (US); Gary Dolny, Mountaintop, PA (US); John Benjamin, Mountaintop, PA (US)

(73) Assignee: Fairchild Semiconductor Corporation, South Portland, ME (US)

(*) Notice: Subject to any disclaimer, the term of this patent is extended or adjusted under 35 U.S.C. 154(b) by 329 days.

(21) Appl. No.: 12/389,335

(22) Filed: Feb. 19, 2009

(65) Prior Publication Data

US 2010/0207205 A1    Aug. 19, 2010

(51) Int. Cl.
*H01L 29/02* (2006.01)
*H01L 21/332* (2006.01)

(52) U.S. Cl. ........ 257/172; 257/243; 257/330; 257/401; 257/E29.197; 257/E21.419; 438/138; 438/270

(58) Field of Classification Search .................. None
See application file for complete search history.

(56) References Cited

U.S. PATENT DOCUMENTS

| | | | |
|---|---|---|---|
| 4,641,174 A | 2/1987 | Baliga |
| 4,697,201 A | 9/1987 | Mihara |
| 4,767,722 A | 8/1988 | Blanchard |
| 4,796,070 A | 1/1989 | Black |
| 4,876,579 A | 10/1989 | Davis et al. |
| 4,881,105 A | 11/1989 | Davari et al. |
| 4,893,160 A | 1/1990 | Blanchard |
| 4,914,058 A | 4/1990 | Blanchard |
| 4,941,026 A | 7/1990 | Temple |
| 4,942,445 A | 7/1990 | Baliga et al. |
| 4,954,854 A | 9/1990 | Dhong et al. |
| 4,974,059 A | 11/1990 | Kinzer |
| 4,982,260 A | 1/1991 | Chang et al. |
| 4,994,883 A | 2/1991 | Chang et al. |
| 5,028,548 A | 7/1991 | Nguyen |

(Continued)

FOREIGN PATENT DOCUMENTS

KR  10-2001-0028167 A  4/2001

(Continued)

OTHER PUBLICATIONS

International Search Report and Written Opinion of the International Searching Authority for PCT Application No. PCT/US2010/022830, mailed Sep. 15, 2010, 10 pages.

*Primary Examiner* — Alonzo Chambliss
(74) *Attorney, Agent, or Firm* — Kilpatrick Townsend & Stockton LLP

(57) ABSTRACT

Various structures and methods for improving the performance of trench-shielded power semiconductor devices and the like are described. An exemplary device comprises a semiconductor region having a surface, a first area of the semiconductor region, a well region of a first conductivity type disposed in the semiconductor region and around the first area, and a plurality of trenches extending in a semiconductor region. Each trench has a first end disposed in a first portion of the well region, a second end disposed in a second portion of the well region, and a middle portion between the first and second ends and disposed in the first area. Each trench further having opposing sidewalls lined with a dielectric layer, and a conductive electrode disposed on at least a portion of the dielectric layer.

34 Claims, 7 Drawing Sheets

U.S. PATENT DOCUMENTS

| | | |
|---|---|---|
| 5,034,341 A | 7/1991 | Itoh |
| 5,072,266 A | 12/1991 | Bulucea et al. |
| 5,077,228 A | 12/1991 | Eklund et al. |
| 5,101,244 A | 3/1992 | Mori et al. |
| 5,119,153 A | 6/1992 | Korman et al. |
| 5,126,807 A | 6/1992 | Baba et al. |
| 5,216,275 A | 6/1993 | Chen |
| 5,233,215 A | 8/1993 | Baliga |
| 5,241,195 A | 8/1993 | Tu et al. |
| 5,262,336 A | 11/1993 | Pike, Jr. et al. |
| 5,321,289 A | 6/1994 | Baba et al. |
| 5,346,835 A | 9/1994 | Malhi et al. |
| 5,365,102 A | 11/1994 | Mehrotra et al. |
| 5,393,998 A | 2/1995 | Ishii et al. |
| 5,424,563 A | 6/1995 | Temple et al. |
| 5,430,324 A | 7/1995 | Bencuya |
| 5,508,534 A | 4/1996 | Nakamura et al. |
| 5,510,634 A | 4/1996 | Okabe et al. |
| 5,528,058 A | 6/1996 | Pike, Jr. et al. |
| 5,541,425 A | 7/1996 | Nishihara |
| 5,541,430 A | 7/1996 | Terashima |
| 5,545,915 A | 8/1996 | Disney et al. |
| 5,557,127 A | 9/1996 | Ajit et al. |
| 5,567,635 A | 10/1996 | Acovic et al. |
| 5,578,851 A | 11/1996 | Hshieh et al. |
| 5,589,405 A | 12/1996 | Contiero et al. |
| 5,597,765 A | 1/1997 | Yilmaz et al. |
| 5,602,046 A | 2/1997 | Calafut et al. |
| 5,605,852 A | 2/1997 | Bencuya |
| 5,607,875 A | 3/1997 | Nishizawa et al. |
| 5,637,898 A | 6/1997 | Baliga |
| 5,639,676 A | 6/1997 | Hshieh et al. |
| 5,644,150 A | 7/1997 | Iwamuro |
| 5,665,996 A | 9/1997 | Williams et al. |
| 5,777,362 A | 7/1998 | Pearce |
| 5,807,783 A | 9/1998 | Gaul et al. |
| 5,814,858 A | 9/1998 | Williams |
| 5,828,101 A | 10/1998 | Endo |
| 5,856,692 A | 1/1999 | Williams et al. |
| 5,859,446 A | 1/1999 | Nagasu et al. |
| 5,877,528 A | 3/1999 | So |
| 5,877,538 A | 3/1999 | Williams |
| 5,894,149 A | 4/1999 | Uenishi et al. |
| 5,920,108 A | 7/1999 | Hemmenway et al. |
| 5,932,897 A | 8/1999 | Kawaguchi et al. |
| 5,949,124 A | 9/1999 | Hadizad et al. |
| 5,972,741 A | 10/1999 | Kubo et al. |
| 5,973,368 A | 10/1999 | Pearce et al. |
| 5,998,822 A | 12/1999 | Wada et al. |
| 6,020,270 A | 2/2000 | Wong et al. |
| 6,049,108 A | 4/2000 | Williams et al. |
| 6,051,468 A | 4/2000 | Hshieh |
| 6,060,744 A | 5/2000 | Kuwahara et al. |
| 6,078,090 A | 6/2000 | Williams et al. |
| 6,104,054 A | 8/2000 | Corsi et al. |
| 6,110,763 A | 8/2000 | Temple |
| 6,130,458 A | 10/2000 | Takagi et al. |
| 6,137,152 A | 10/2000 | Wu |
| 6,140,680 A | 10/2000 | Pulvirenti |
| 6,168,996 B1 | 1/2001 | Numazawa et al. |
| 6,174,773 B1 | 1/2001 | Fujishima |
| 6,188,104 B1 | 2/2001 | Choi et al. |
| 6,188,105 B1 | 2/2001 | Kocon et al. |
| 6,208,185 B1 | 3/2001 | John et al. |
| 6,211,018 B1 | 4/2001 | Nam et al. |
| 6,242,787 B1 | 6/2001 | Nakayama et al. |
| 6,252,277 B1 | 6/2001 | Chan et al. |
| 6,259,136 B1 | 7/2001 | Kawaguchi et al. |
| 6,262,439 B1 | 7/2001 | Takeuchi et al. |
| 6,274,437 B1 | 8/2001 | Evans |
| 6,274,905 B1 | 8/2001 | Mo |
| 6,316,280 B1 | 11/2001 | Fujiwara |
| 6,337,499 B1 | 1/2002 | Werner |
| 6,362,026 B2 | 3/2002 | Zeng et al. |
| 6,365,462 B2 | 4/2002 | Baliga |
| 6,376,878 B1 | 4/2002 | Kocon |
| 6,384,955 B2 | 5/2002 | Tada et al. |
| 6,388,286 B1 | 5/2002 | Baliga |
| 6,392,290 B1 | 5/2002 | Kasem et al. |
| 6,396,102 B1 | 5/2002 | Calafut |
| 6,437,386 B1 | 8/2002 | Hurst et al. |
| 6,437,419 B1 | 8/2002 | Bhalla et al. |
| 6,445,035 B1 | 9/2002 | Zeng et al. |
| 6,459,113 B1 | 10/2002 | Morihara et al. |
| 6,461,918 B1 | 10/2002 | Calafut |
| 6,465,325 B2 | 10/2002 | Ridley et al. |
| 6,482,681 B1 | 11/2002 | Francis et al. |
| 6,492,663 B1 | 12/2002 | Blanchard |
| 6,514,857 B1 | 2/2003 | Naik et al. |
| 6,534,825 B2 | 3/2003 | Calafut |
| 6,548,317 B2 | 4/2003 | Taniguchi et al. |
| 6,573,558 B2 | 6/2003 | Disney |
| 6,573,569 B2 | 6/2003 | Hao et al. |
| 6,586,800 B2 | 7/2003 | Brown |
| 6,602,768 B2 | 8/2003 | Kocon et al. |
| 6,620,653 B2 | 9/2003 | Matsudai et al. |
| 6,624,472 B2 | 9/2003 | Hurkx et al. |
| 6,635,535 B2 | 10/2003 | Hao et al. |
| 6,638,826 B2 | 10/2003 | Zeng et al. |
| 6,653,161 B1 | 11/2003 | Morse |
| 6,653,740 B2 | 11/2003 | Kinzer et al. |
| 6,673,680 B2 | 1/2004 | Calafut |
| 6,673,681 B2 | 1/2004 | Kocon et al. |
| 6,677,626 B1 | 1/2004 | Shindou et al. |
| 6,680,232 B2 | 1/2004 | Grebs et al. |
| 6,683,346 B2 | 1/2004 | Zeng |
| 6,683,363 B2 | 1/2004 | Challa |
| 6,690,062 B2 | 2/2004 | Henninger et al. |
| 6,696,726 B1 | 2/2004 | Bencuya et al. |
| 6,696,728 B2 | 2/2004 | Onishi et al. |
| 6,700,158 B1 | 3/2004 | Cao et al. |
| 6,710,406 B2 | 3/2004 | Mo et al. |
| 6,724,042 B2 | 4/2004 | Onishi et al. |
| 6,734,497 B2 | 5/2004 | Takahashi et al. |
| 6,750,508 B2 | 6/2004 | Omura et al. |
| 6,777,747 B2 | 8/2004 | Yedinak et al. |
| 6,798,019 B2 | 9/2004 | Yedinak et al. |
| 6,802,719 B2 | 10/2004 | Finney |
| 6,803,626 B2 | 10/2004 | Sapp et al. |
| 6,809,375 B2 | 10/2004 | Takemori et al. |
| 6,818,947 B2 | 11/2004 | Grebs et al. |
| 6,825,510 B2 | 11/2004 | Probst |
| 6,828,195 B2 | 12/2004 | Mo et al. |
| 6,831,329 B2 | 12/2004 | Yedinak et al. |
| 6,838,722 B2 | 1/2005 | Bhalla et al. |
| 6,844,592 B2 | 1/2005 | Yamaguchi et al. |
| 6,861,701 B2 | 3/2005 | Williams et al. |
| 6,906,362 B2 | 6/2005 | Yedinak et al. |
| 6,916,745 B2 | 7/2005 | Herrick et al. |
| 6,979,874 B2 | 12/2005 | Harada |
| 6,982,459 B2 | 1/2006 | Suzuki et al. |
| 7,005,351 B2 | 2/2006 | Henninger et al. |
| 7,064,385 B2 | 6/2006 | Dudek et al. |
| 7,078,296 B2 | 7/2006 | Chau et al. |
| 7,091,573 B2 | 8/2006 | Hirler et al. |
| 7,118,951 B2 | 10/2006 | Yedinak et al. |
| 7,132,712 B2 | 11/2006 | Kocon et al. |
| 7,148,111 B2 | 12/2006 | Mo et al. |
| 7,170,119 B2 | 1/2007 | Yamauchi et al. |
| 7,250,343 B2 | 7/2007 | Kotek et al. |
| 7,319,256 B1 | 1/2008 | Kraft et al. |
| 7,344,943 B2 | 3/2008 | Herrick et al. |
| 7,345,342 B2 | 3/2008 | Challa et al. |
| 7,352,036 B2 | 4/2008 | Grebs et al. |
| 7,382,019 B2 | 6/2008 | Marchant et al. |
| 7,385,248 B2 | 6/2008 | Herrick et al. |
| 7,393,749 B2 | 7/2008 | Yilmaz et al. |
| 7,416,948 B2 | 8/2008 | Kraft et al. |
| 7,436,021 B2 | 10/2008 | Hao et al. |
| 7,446,374 B2 | 11/2008 | Thorup et al. |
| 7,449,354 B2 | 11/2008 | Marchant et al. |
| 7,476,589 B2 | 1/2009 | Grebs et al. |
| 7,485,532 B2 | 2/2009 | Marchant et al. |
| 7,504,303 B2 | 3/2009 | Yilmaz et al. |
| 7,504,306 B2 | 3/2009 | Sapp et al. |
| 7,511,339 B2 | 3/2009 | Mo et al. |
| 7,514,322 B2 | 4/2009 | Yilmaz et al. |

| | | |
|---|---|---|
| 7,521,773 B2 | 4/2009 | Yilmaz et al. |
| 7,560,771 B2 | 7/2009 | Nakamura et al. |
| 7,582,519 B2 | 9/2009 | Kocon et al. |
| 7,595,524 B2 | 9/2009 | Herrick et al. |
| 7,595,542 B2 | 9/2009 | Park |
| 7,598,144 B2 | 10/2009 | Herrick et al. |
| 7,612,408 B2 | 11/2009 | Zundel et al. |
| 7,625,793 B2 | 12/2009 | Calafut |
| 7,625,799 B2 | 12/2009 | Yilmaz et al. |
| 7,638,841 B2 | 12/2009 | Challa |
| 2005/0161735 A1 | 7/2005 | Aoki et al. |
| 2005/0167742 A1 | 8/2005 | Challa et al. |
| 2005/0181564 A1 | 8/2005 | Hshieh et al. |
| 2005/0224848 A1 | 10/2005 | Kurosaki et al. |
| 2005/0242411 A1 | 11/2005 | Tso |
| 2006/0214222 A1* | 9/2006 | Challa et al. .................. 257/328 |
| 2006/0267088 A1 | 11/2006 | Sharp et al. |
| 2006/0267090 A1 | 11/2006 | Sapp et al. |
| 2006/0273386 A1 | 12/2006 | Yilmaz et al. |
| 2006/0289929 A1 | 12/2006 | Andrews |
| 2007/0001230 A1 | 1/2007 | Lee et al. |
| 2007/0029597 A1 | 2/2007 | Lee et al. |
| 2007/0032020 A1 | 2/2007 | Grebs et al. |
| 2007/0069324 A1 | 3/2007 | Takaishi |
| 2007/0181927 A1 | 8/2007 | Yedinak et al. |
| 2008/0017920 A1 | 1/2008 | Sap et al. |
| 2008/0135889 A1 | 6/2008 | Session |
| 2008/0197407 A1* | 8/2008 | Challa et al. .................. 257/330 |
| 2008/0199997 A1* | 8/2008 | Grebs et al. .................. 438/270 |
| 2008/0265276 A1* | 10/2008 | Noda et al. .................. 257/139 |
| 2009/0035900 A1 | 2/2009 | Thorup et al. |
| 2009/0200606 A1 | 8/2009 | Yilmaz et al. |
| 2010/0032790 A1 | 2/2010 | Rinehimer |

FOREIGN PATENT DOCUMENTS

| | | |
|---|---|---|
| KR | 10-2008-0095768 A | 10/2008 |
| WO | WO 2006-135746 A2 | 12/2006 |
| WO | WO 2007-002857 A2 | 1/2007 |

* cited by examiner

TRENCH-SHIELDED SEMICONDUCTOR DEVICE

BACKGROUND OF THE INVENTION

The present inventions relate in general to semiconductor technology, and in particular to power semiconductor devices and methods of manufacturing the same.

Several types of power semiconductor devices, such as transistors and diodes, comprise vertical devices. A vertical device generally comprises a mesa structure formed in a semiconductor epitaxial layer of a semiconductor substrate, where the mesa is defined by one or more trenches disposed in the epitaxial layer and around the mesa. A controllable current flows from the mesa's top to the mesa's bottom, in a direction that is generally perpendicular (e.g., vertical) to the surfaces of the epitaxial layer and semiconductor substrate. The vertical device typically has an ON-state where the current flows through the mesa with a low amount of electrical resistance, and an OFF-state where the current flow is substantially suppressed, except for a very small leakage current. In the OFF-state, the voltage that can be sustained through the mesa while suppressing current flow can be very high, such as in the range of several tens of volts. However, due to various processes occurring in the semiconductor material, such as carrier avalanche, the ability to suppress the current flow in the OFF-state fails at a certain level of voltage, which is often called the breakdown voltage.

There is a continuing need to improve the reliability and performance of trench-shield power semiconductor devices. This includes increasing the value of the aforementioned breakdown voltage, and improving the electrical characteristics of the devices formed in the mesas.

BRIEF SUMMARY OF THE INVENTION

A first invention of the present application is directed to a trench-shielded semiconductor device. A first general exemplary embodiment thereof broadly comprises a semiconductor region having a surface; a first area of the semiconductor region; a well region of a first conductivity type disposed in the semiconductor region and around the first area; and a plurality of trenches extending in a semiconductor region. Each trench has a first end disposed in a first portion of the well region, a second end disposed in a second portion of the well region, and a middle portion between the first and second ends and disposed in the first area. Each trench further has opposing sidewalls lined with a dielectric layer, and a conductive electrode disposed on at least a portion of the dielectric layer. A device region of any suitable and desired type may be disposed between the middle portions of adjacent trenches. The above configuration aids in pushing away electric potential lines and fields from the device region to increase the breakdown voltage of the device. Further exemplary embodiments of this invention may include end trenches disposed on either side of the plurality of initially-recited trenches, with each such end trenches being disposed in a respective portion of the well region. Yet further exemplary embodiments may include additional end trenches disposed at the first and second ends of the plurality of initially recited trenches, with each such additional end trenches being disposed in a respective portion of the well region. The above configuration further aids in pushing away electric potential lines and fields from the device region to increase the breakdown voltage of the device.

A second invention of the present application is directed to a method of manufacturing a semiconductor device with one or more trenches. As part of making this invention, the inventors have discovered that trenches with rounded bottom walls, and with improved quality of the dielectric layer, can provide improved breakdown voltages. A general exemplary embodiment of this invention comprises: forming one or more initial trenches into a semiconductor region, each trench having a bottom wall and one or more side walls; growing a sacrificial oxide layer on the walls of the initial trenches; removing the sacrificial oxide layer; forming a dielectric layer on the side and bottom walls of the one or more trenches after removing the sacrificial oxide layer; and filling the one or more trenches with electrically conductive material. The inventors have found that the growth and removal of the sacrificial oxide rounds the bottom walls of the trenches, and improves the quality of the subsequently formed dielectric layer by tying up (i.e., resolving) dangling bonds of the etched semiconductor material of the trench walls.

A third invention of the present application is directed to a method of manufacturing a semiconductor device with one or more trenches. As part of making this invention, the inventors have found that a conductive bridge can form in the dielectric layer of the trench that can lead to a breakdown condition, and have found a way to grow a better oxide dielectric layers that resist the formation of such conductive bridges. A general exemplary embodiment of this invention comprises: forming one or more trenches into a semiconductor region, each trench having a bottom wall and one or more side walls; growing an oxide layer on the trench bottom and side walls of the one or more trenches at a temperature of 1100° C. or higher in a dry oxygen environment that is diluted with one or more inert gases; and filling the one or more trenches with electrically conductive material. The above conditions of oxide grown, in the context of a trench-shielded power device, provides better a dielectric layer of better quality.

A fourth invention of the present application is directed to a photomask for defining photoresist layers, with the defined photoresist layer being used in turn to define trenches in a semiconductor wafer. An exemplary semiconductor wafer may have a first area at a first surface, a second area at the wafer's surface and adjacent to the first area, and a peripheral edge between the first and second areas. The first area is at a different height relative to the second area, being recessed or elevated. The second area may include an active area of a die where trenches are to be formed, and the first area may be formed around the second area. These trenches may also extend into the first area. The inventors have found that conventional photomasks have difficulty in defining the photoresist layers in the lowermost one of the first and second areas at sub-micron trench dimensions. The third invention of the present application provides a photomask with optical proximity correction features for defining the photoresist trench areas in the lowermost one of the first and second areas. An exemplary embodiment according to this invention comprises an alignment mark for aligning the photomask to the peripheral edge between the first and second areas of the semiconductor wafer, and an array of striped regions for defining a plurality of trenches in the first surface of the semiconductor wafer. Each striped region has a first portion to be aligned within the first area of the semiconductor wafer and a second portion to be aligned within the second area. The first portion of the striped region has a first width and the second portion the striped region has a second width, wherein the first width is different from the second width. When defining positive-tone photoresists, the width aligned over the lowermost area may be greater than the width aligned over the other area. When defining negative-tone photoresists, the width aligned over the lowermost area may be less than the width aligned over the other area.

A fifth invention of the present application is directed to a trench-shielded semiconductor device having p-doped polysilicon trench electrodes. The inventors have discovered that the p-doped polysilicon material enhances the ability of the trench electrodes to shield the mesas of the device from electric potential lines and fields, and increases the breakdown voltage of the device. A first exemplary embodiment of this invention is directed to a semiconductor device, the device broadly comprising: a semiconductor region having a surface; and a plurality of trenches extending in a semiconductor region, each trench having a first end, a second end, and a middle portion between the first and second ends, each trench further having opposing sidewalls lined with a dielectric layer, and a conductive electrode disposed on at least a portion of the dielectric layer, wherein the conductive electrode comprises p-doped polysilicon. A second exemplary embodiment of this invention is directed to a method of manufacturing a semiconductor device with one or more trenches, the method broadly comprising: forming one or more trenches into a semiconductor region, each trench having a bottom wall and one or more side walls, the one or more trenches defining surfaces of the semiconductor region that are adjacent to the one or more trenches; forming a dielectric layer on the side and bottom walls of the one or more trenches; and filling the one or more trenches with p-doped polysilicon material. The polysilicon may doped by in situ doping during deposition, by implantation with p-type dopant after deposition, or by vapor-phase exposure to p-type dopant during anneal.

These and other embodiments of these inventions and of other inventions are described in detail in the Detailed Description with reference to the Figures.

Aspects of the exemplary embodiments and the present inventions described herein may be used alone or in any combination.

DETAILED DESCRIPTION OF THE INVENTION

Figure 1:
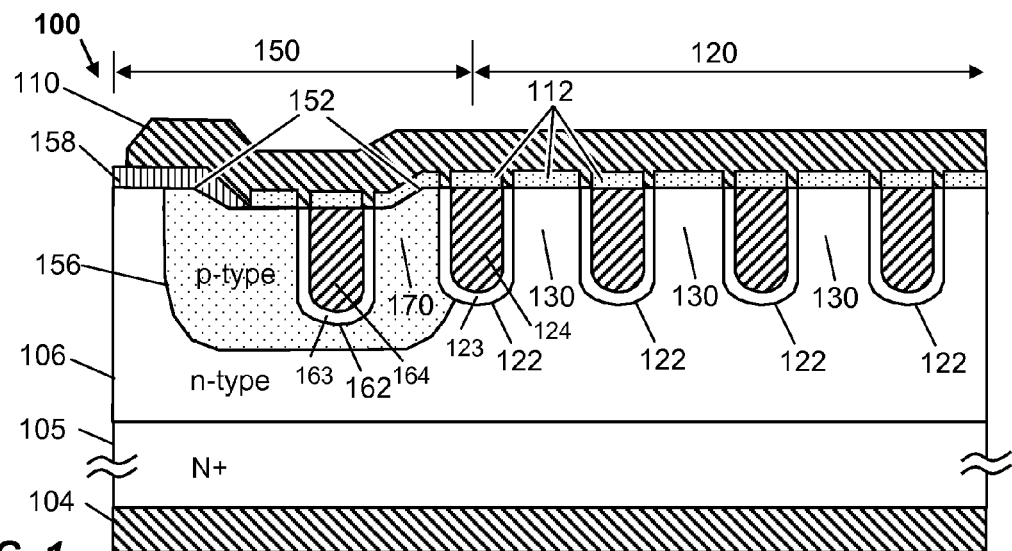
FIG. 1 shows a partial cross section view of an exemplary trench-shielded power semiconductor device according to an invention of the present application.

The techniques in accordance with the present inventions will be described more fully hereinafter with reference to the accompanying drawings, in which exemplary embodiments of the inventions are shown. The inventions may, however, be embodied in different forms and should not be construed as limited to the embodiments set forth herein. Rather, these embodiments are provided so that this disclosure is thorough and complete and fully conveys the scope of the inventions to one skilled in the art. In the drawings, the thicknesses of layers and regions may be exaggerated for clarity. The same reference numerals are used to denote the same elements throughout the specification.

It will be understood that when an element, such as a layer, a region, an electrode, etc., is referred to as being "over," "on," "connected to," "coupled to," "electrically coupled to," etc. another element, it may be directly over, on, connected to, or coupled to the other element or intervening elements may be present. In contrast, when an element is referred to as being "directly on," "directly connected to," "directly coupled to," "directly electrically connected to," etc. another element, there are no intervening elements present. Spatially relative terms, such as "over," "under," "above," "below," "upper," "lower," "front," "back," "right," "left," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the object in the figures is turned over, elements described as "under" or "below" other elements or features would then be oriented "over" or "above" the other elements or features. Thus, the exemplary term "above" may encompass both an above and below orientation.

The terms used herein are for illustrative purposes of the present inventions only and should not be construed to limit the meaning or the scope of the present inventions. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. The term "and/or" used herein includes any and all combinations of one or more of the associated listed items. As used herein, terms such as "first," "second," etc. are used to describe various items. However, it is obvious that such items should not be defined by these terms. The terms are used only for distinguishing one item from another item. Thus, a first item which will be described may also refer to a second item without departing from the scope of the present invention.

As is known in the semiconductor art, there are n-type dopants (e.g., arsenic, phosphorus) that may be implanted, diffused, or grown into a semiconductor region to make it n-type, and there are p-type dopants (e.g., boron) that may be implanted, diffused, or grown into a semiconductor region to make the region p-type. In many device fabrication processes, it is common to implant or diffuse an n-type dopant into an existing p-type region to make a sub-region that is n-type. In that n-type sub-region, the concentration of n-type dopant exceeds the concentration of the p-type dopant. There is a "net" n-type doping concentration in that sub-region that is equal to the concentration of the introduced n-type dopant minus the concentration of the existing p-type dopant. A substantial portion of the electrical properties of the n-type sub-region is related to the net n-type doping concentration (rather than the concentration of the introduced n-type dopant), and for that reason the semiconductor art makes the distinction between net and introduced concentrations. Other regions of a device may be formed with only one type of dopant introduced into the regions during formation, in which case the "net" doping concentration is equal to the introduced doping concentration.

FIG. 1 shows a partial cross-sectional view of an exemplary trench-shielded power semiconductor device 100 according to the present invention. Device 100 may comprise a Schottky barrier rectifier, p-n junction rectifier, a MOSFET transistor, a BJT transistor, an IGBT transistor, or combination thereof. For the purposes of illustration, and without loss of generality, device 100 is illustrated herein as comprising an active Schottky barrier rectifier in a central region of the device's die, and a parasitic p-n junction rectifier in a field-termination region around the periphery of the central portion.

Device 100 comprises a N+ doped semiconductor substrate 105, a first conductive layer 104 disposed on the bottom surface of substrate 105, and one or more epitaxially grown semiconductor n-type layers 106 ("epitaxial semiconductor layers") disposed on the top surface semiconductor substrate 105. As indicated above, a semiconductor region may be doped as an n-conductivity type region (or "n-type region") with an n-type dopant, doped as a p-conductivity type region (or "p-type region") with a p-type dopant, or left undoped ("intrinsic type region"). Device 100 further comprises a device region 120, or active area 120, where the active components of the device are located (e.g., Schottky barrier rectifier), and a field termination region 150, which shapes the electric fields at the periphery of the die to improve the reverse breakdown voltage of the device. The field termination region 150 has a parasitic p-n junction rectifier, as explained below.

In device region 120, device 100 further comprises a plurality of trenches 122 disposed in semiconductor layer 106, a plurality of mesas 130 of semiconductor material interleaved between trenches 122, a conductive contact layer 112 disposed over the tops of mesas 130, and a second conductive layer 110 disposed over contact layer 112. Each trench 122 extends from the top surface of layer 106 into layer 106 toward substrate 105, and has opposing sidewalls lined with a dielectric layer 123, and a shield electrode 124 disposed between the sidewalls. Contact layer 112 forms individual Schottky barrier diodes with each mesa 130, where the diodes are electrically coupled in parallel between the first conductive layer 104 and second conductive layer 110. Contact layer 112 is the anode of the Schottky barrier rectifier, and substrate 105 is the cathode. First conductive layer 104 provides a cathode terminal of the rectifier, and second conductive layer 110 provides an anode terminal. As an artifact of an exemplary manufacturing process, contact layer 112 may be interposed between shield electrodes 124 and second conductive layer 110, in which case it forms electrical contacts to both shield electrodes 124 and layer 110.

Shield electrodes 124 are electrically coupled to the same electrical potential as contact layer 112 by second conductive layer 110. They act to establish electrically insulated islands of anode potential deep within semiconductor layer 106, and below the top surfaces of mesas 130, thereby substantially shielding the Schottky contacts between contact layer 112 and the tops of mesas 130 from the cathode potential that is present on substrate 105 and the lower portions of semiconductor layer 106. Shield electrodes 124 also act to deplete mesas 130 of carriers (electrons), which causes the distribution of the equal-potential lines of any reverse-bias voltage that do extend into mesas 130 (primarily along their center-lines) to be distributed in a substantially linear manner along their heights rather than being concentrated at the tops of the mesas. This significantly improves the reverse-bias leakage current and breakdown voltage of the Schottky barrier diodes by keeping the equal-potential lines of reverse-bias voltage away from the Schottky contacts. Trenches 122 may have a depth of a 0.05 to 2.0 microns for low breakdown voltage applications ($V_B<50V$), a depth of 1 to 5 microns for medium breakdown voltage applications ($90V<V_B<150V$), or a depth of up to 25 microns for very high breakdown voltage applications.

In field termination region 150, device 100 further comprises a relatively deep net p-doped isolation well 156 disposed in semiconductor layer 106, an end trench 162 disposed in isolation well 156 adjacent to the leftmost trench 122 in device area 120, and an end mesa 170 disposed between end trench 162 and the leftmost trench 122. Each of isolation well 156 and end trench 162 extend from the top surface of semiconductor layer 106 into layer 106 and toward substrate 105. The rightmost edge of well 156 terminates within end mesa 170 or at the leftmost trench 122 of device area 120. End trench 162 is preferably contained within isolation well 156. End trench 162 has opposing sidewalls lined with a dielectric layer 163, and a shield electrode 164 disposed between the sidewalls. Second conductive layer 110 is disposed over isolation well 156 and electrically coupled to well 156 and shield electrode 164 of end trench 162. A dielectric field layer 158 is disposed between well 156 and second conductive layer 110 at the leftmost edge of well 156 (e.g., along the periphery of field termination area 150). As an artifact of an exemplary manufacturing process, contact layer 112 may be interposed between well 156 and second conductive layer 110, in which case it forms electrical contacts to both well 156 and layer 110. (A conductive contact is made from layer 112 to well 156 because of the well's relatively high p-type doping level compared to the lower n-type doping levels of mesas 130.) Also as an artifact, contact layer 112 may be interposed between shield electrode 164 and second conductive layer 110, in which case it forms electrical contacts to both shield 164 and layer 110.

Because of its electrical coupling to second conductive layer 110, isolation well 156 is electrically coupled to the same potential that is present on shield electrodes 124, 164 and contact layer 112. Well 156 forms a p-n junction between itself and n-type layer 106, depleting the area of layer 106 around well 156 of carriers and pushing electric fields away from trenches 122, 162 and end mesa 170. Even with trenches 122 in place, the equal-potential lines and electric fields of reverse-biased voltage creep into the bottom portions of mesas 130, primarily along their centerlines, which can initiate the carrier-avalanche breakdown conditions that define the breakdown voltage. Without well 156 and trench 162, the equal-potential lines and electric fields of the reverse-biased voltage would creep into the leftmost mesa 130 to a greater extent than the interior mesas 130, making the leftmost mesa 130 the location of the breakdown condition. Without well 156 and trench 162, the value of breakdown voltage at the leftmost mesa 130 would be lower than the values of interior mesas 130 because of the greater extent of the equal-potential lines and electric fields in the leftmost mesa 130. Isolation well 156 and end trench 162 act to push the equal-potential lines and electric fields away from the left most trench 122, preventing the electric potential and fields from creeping into the leftmost trench 130 to a greater degree. In fact, the well 156 and trench 162 may be configured to cause the electric potential and fields from creeping into the leftmost trench 130 to a lesser degree than the interior mesas. This would cause the avalanche breakdown condition to occur within the central portion of device area 120, which would distribute the reverse-bias current over a larger area to reduce the current's damaging effects. If desired, the doping levels of well 156 and n-type layer 106 can be selected to provide the p-n junction with a larger breakdown voltage than that of the interior portion of device area 120, or to provide the p-n junction with a lower breakdown voltage. In the latter case, the damage effects of the reverse-biased breakdown current are focused onto the p-n junctions. The selection of such doping levels is within the ordinary skill of designers in the semiconductor device art, and can be guided by computer simulation programs that are widely available in the art.

As can be seen in FIG. 1, there is a small recess 152 in the top surface of semiconductor layer 106, within field termination region 150. Recess 152 is created during an exemplary manufacturing process to provide an alignment mark for various photo-lithographic masks of the process. As a result of the recess and other features of the manufacturing process, the depth of the bottom of trench 162 is lower than the depth of the bottoms of trenches 122. The lower depth of the bottom of end trench 162 further aids in pushing the equal-potential lines and electric fields away from the left most trench 122, and in increasing the breakdown voltage of the device. In other implementations of the device 100, the depth of the bottom of trench 162 can be equal to the depth of trenches 122, which can be effected by using a narrower lithographic window to define trench 162, or using a different alignment approach that does not form recess 152. The width of trench 162 can be in the range of 0.8 times the width of trench 122 to 1.2 times the width of trench 122, and the width of end mesa 170 can be in the range of 0.5 times the width of mesa 130 to 1.25 times the width of mesa 130. In preferred embodiments, the width of trench 162 is substantially the same as the width of trench 122, as measured at the tops of the trenches (preferably within 0.1 microns, and more preferably within 0.05 microns for trench widths of less than one micron). Also in preferred embodiments, the width of end mesa 170 is in the range of 0.8 times and 1.2 times the width of mesa 130, as measured at the tops of the mesas (preferably within 0.1 microns, and more preferably within 0.05 microns for trench widths of less than one micron). The above widths may be measured on actual die, using line segments least-squares fitted to the trench and mesa edges, if needed. For sub-micron trench widths and mesa widths, achieving these preferred dimensions (with recess 152 present) is difficult using conventional photolithographic methods. However, an optical-proximity-correction (OPC) photolithographic invention described below can be used to readily achieve these preferred dimensions. A set of typical dimensions that can be achieved with the OPC feature includes a trench width of approximately 0.5 microns, a trench depth of approximately 1.1 microns, a trench dielectric layer thickness of approximately 400 to 500 Angstroms, a mesa width of approximately 0.3 microns, and pitch between adjacent trenches 122 of approximately 0.8 microns.

Figure 2:
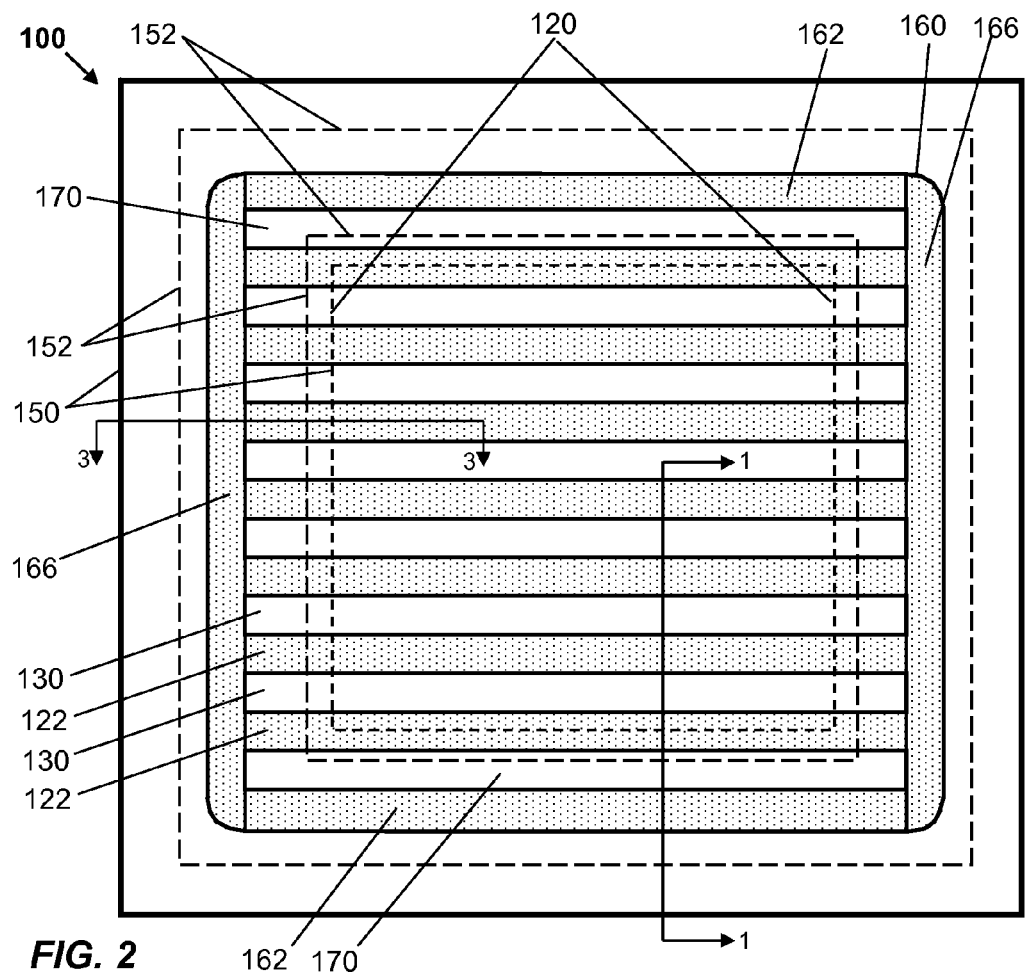
FIG. 2 shows a top plan view of the exemplary device shown in FIG. 1 according to an invention of the present application.

FIG. 2 shows a top plan view of device 100, with the location of the cross section of FIG. 1 shown by cut line 1-1. The locations of active area 120, field termination area 150, recess 152, trenches 122, mesas 130, end trenches 162, and end mesas 170 are shown. In order to clearly show these features in the figure, an implementation of device 100 with a relatively small number of trenches 122 and mesas 130 has been shown. Typical implementations can have fifty or more trenches 122 with fifty or more mesas 130 (minus one). Implementations using 1,000 trenches or more are also possible. Also shown in FIG. 2 are two additional end trenches 166 at the left and right sides of the array of trenches 122. Additional end trenches 166 preferably make contact to the ends of trenches 122 and 162 (e.g., abut the ends), and for this reason they may be called "end-of-trench" trenches 166. They have the same construction as trenches 162, with sidewalls lined with a dielectric layer and a shield electrode. The combination of end trenches 162 and 166 comprises a perimeter trench 160.

Figure 3:
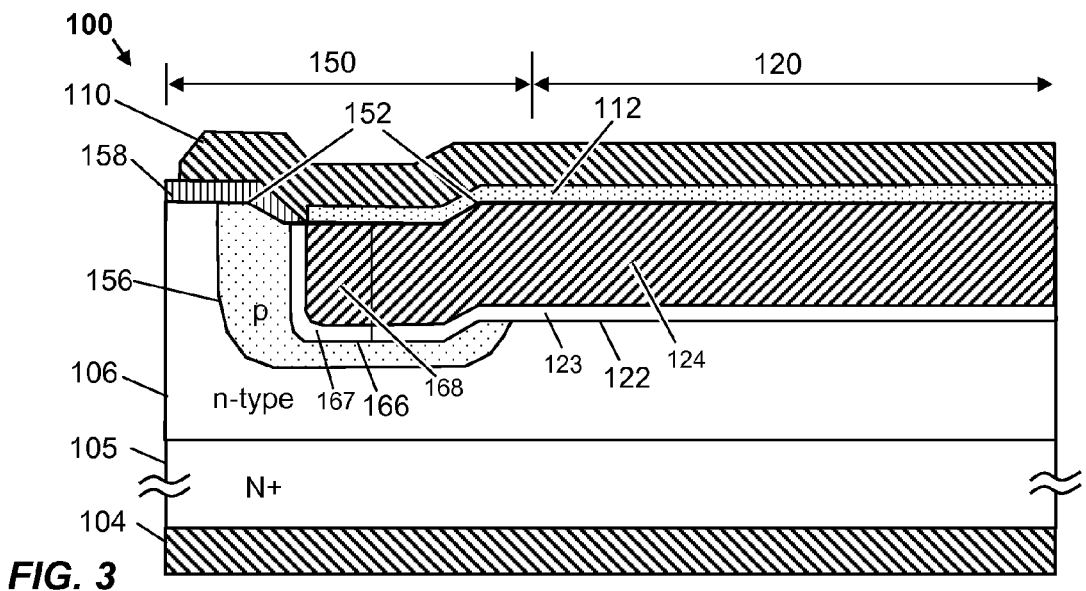
FIG. 3 shows another partial cross section view of the exemplary device shown in FIGS. 1 and 2 according to an invention of the present application.

FIG. 3 shows a cross section of device 100 taken along the cut line 3-3 shown in FIG. 2. This cross section shows the lengthwise construction of a trench 122, and how it terminates at an end trench 166. Also shown in the cross section is a dielectric layer 167 that lines the sidewalls of trench 166, and shield electrode 168 that is disposed in trench 166. Shield electrode 168 preferably makes electrical contact with shield electrode 124 of trench 122. End trench 166 is preferably disposed within p-well 156. A cross section taken along end trench 162 has the same form as that shown in FIG. 3. As a result of recess 152, the depths of the bottoms of the end portions of each trench 122 and 162 are lower than the depth of the trenches middle portion in the embodiment shown in the figure. The lower depth of the end portions of the trenches further aids in pushing the equal-potential lines and electric fields away from the active area of the trenches, thereby increasing the breakdown voltage of the device.

An exemplary width of region 156 in a typical embodiment is about 9 microns. An additional advantage of placing end trenches 162 and 166 within region 156 is that precision needed for aligning the side walls of region 156 with the locations of the outermost trenches 122 can be significantly reduced since trenches 162 and 166 provide carrier depletion of mesas 170 in the case that region 156 does not fully extend across the widths of mesas 170 (shown in FIGS. 1-2). In other implementations, end trenches 166 may be omitted. In these implementations, the ends of trenches 122 and 162 extend into region 156 by a distance that is equal to or greater than the width of the trench, but each such end is spaced from the outermost side wall (outer peripheral edge) of region 156 by at least one depletion depth. The depletion depth can be easily determined by one of ordinary skill in the art from the thickness of the trench dielectric layer, the work function of the conductive material inside the trench, and the net doping level of region 156 in the vicinity of the trench end. As a general rule for typical implementations, this depletion depth is equal to or less than the width of mesa 170.

Figure 4:
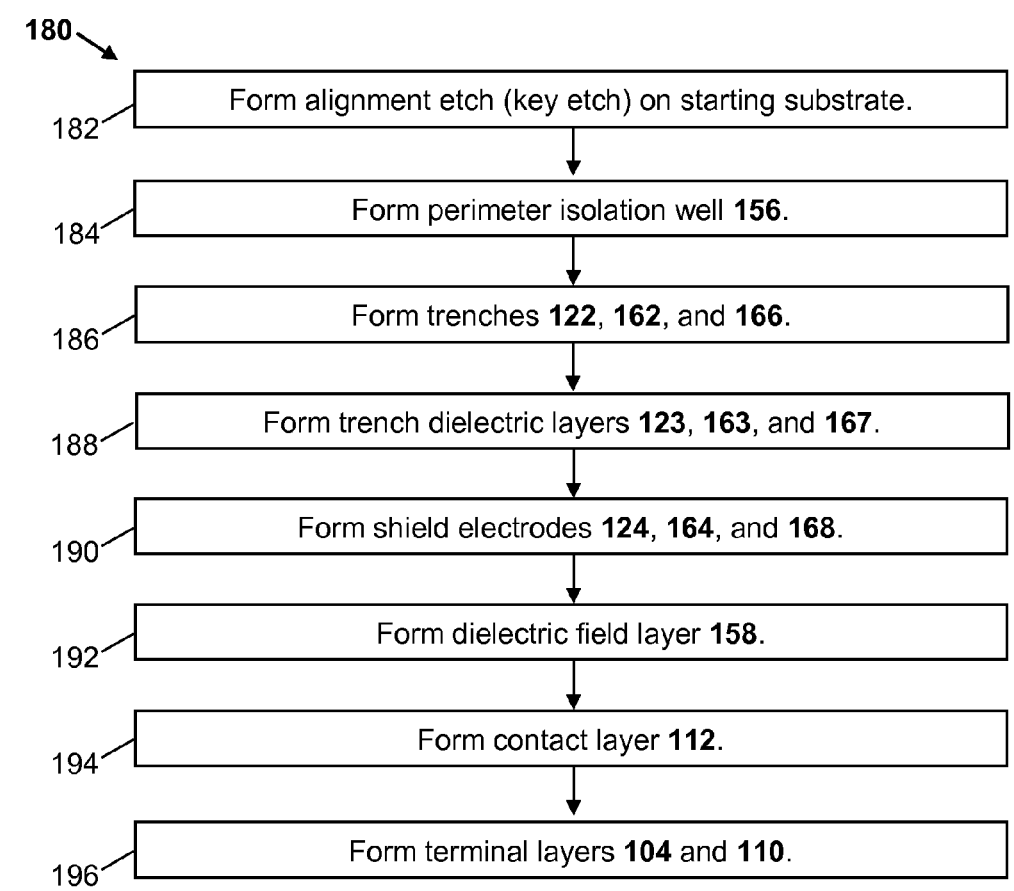
FIG. 4 shows a flow diagram illustrating exemplary methods of manufacturing a trench-shielded power semiconductor device according to additional inventions of the present application.

An exemplary method for making device 100 is now described with reference to the flow diagram 180 shown in FIG. 4. Flow diagram 180 has a plurality of blocks, with one or more actions occurring at each block. At block 182, an alignment etch, or "key etch," is performed at the top surface of a semiconductor wafer to form recess 152 (shown in FIGS. 1-3). This action may comprise forming a photoresist layer over the substrate's top surface, exposing the photoresist to a pattern of actinic radiation so that the portions of the photoresist that overlay the locations of recess 152 can be removed, developing the exposed photoresist to remove those portions to leave exposed portions of the substrate's top surface. The exposed portions are thereafter exposed to an etchant that removes the substrate's material in the exposed areas.

Plasma-based (dry) etches or aqueous chemical (wet) etches may be used. The etch may have an isotropic characteristic, an anisotropic characteristic, or a combination of both characteristics. Currently, an isotropic plasma is preferred for silicon wafers. The key etch may provide recess 152 with a depth that ranges from 500 Angstroms to 2000 Angstroms, with 1200 Angstroms being typically used.

Figure 5:
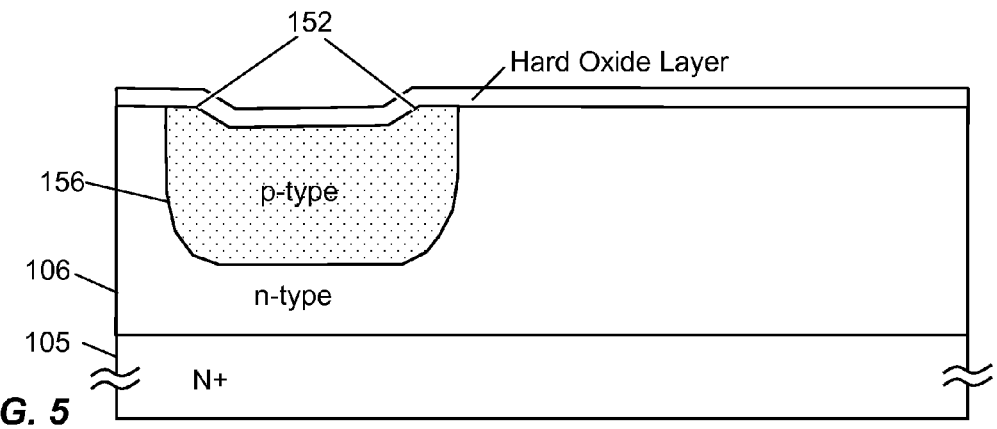
FIGS. 5-10 illustrate cross sections of a trench-shielded power semiconductor device during various stages of manufacturing according the exemplary methods illustrated in FIG. 4 according to inventions of the present application.

At block 184, isolation well 156 may be formed. This action may comprise ion-implanting a dopant into the etched area of recess 152, using the previously disposed patterned photoresist layer as an ion implantation mask. An implantation dose of $5 \times 10^{13}$ dopant atoms (e.g., boron for p-type) per square centimeter at an implantation energy of 40 KeV may be used. The photoresist layer may then be stripped off (such as with an oxygen plasma clean), and the substrate's top surface may be cleaned with a conventional $H_2SO_4/H_2O_2$ etch followed by an RCA SC-1 standard cleaning etch. The implant may then be driven in by a conventional diffusion process, which may comprise an exposure to a temperature of 1150° C. in a substantially inert atmosphere (e.g., 99% nitrogen, 1% oxygen) for a time sufficient to drive the implant to a depth of around 1.2 to 1.3 microns. In preparation for forming trenches 122, 162, and 166, a hard oxide layer may be grown over the top surface of the substrate immediately following the diffusion process using the same diffusion oven. The hard oxide layer may have a thickness of around 2100 Angstroms, and may be grown at a temperature of 950° C. initially in a steam environment, followed by a dry oxygen (no water vapor) environment, which reduces variations in the oxide thickness across the wafer and between wafers. The result of these processes is shown in FIG. 5. The hard oxide layer is used as a etch mask in a subsequent etching step. Its thickness is selected to enhance the photolithographic resolution of patterns formed in the layer, as described below, and to ensure that a significant amount of the layer remains after that etching step.

At block 186 (FIG. 4), trenches 122, 162, and 166 may be formed. This action may comprise forming the hard oxide layer described above, followed by forming a photoresist layer over the hard oxide layer, exposing the photoresist to a pattern of actinic radiation so that the portions of the photoresist that overlay the locations of the trenches can be removed, developing the exposed photoresist to remove those portions to leave exposed portions of the hard oxide layer. Using methods well known to the art, the combined thickness of the photoresist layer and the hard oxide layer is selected to maximize the absorption of the actinic radiation by these layers during the photolithography step, thereby minimizing back reflections and improving the resolution of the pattern features (e.g., improving the critical dimensions). As described below in greater detail, the photomask used to pattern expose the photoresist may incorporate one or more OPC features to facilitate the formation of sub-micron width trenches in recess 152. Thereafter, the exposed portions of the hard mask may be removed by etching, such as by a plasma etch suitable for removed oxide, leaving exposed portions of the semiconductor substrate where the trenches are to be formed. The photoresist layer may then be stripped off (such as with a plasma clean), and the substrate's top surface may be cleaned with a conventional $H_2SO_4/H_2O_2$ etch followed by an RCA SC-1 standard cleaning etch. Thereafter, the trenches may be formed by exposing the exposed portions of the semiconductor substrate to an anisotropic plasma etching process. Currently, it is preferred to form the trenches with rounded bottom surfaces, and fluorine-based plasma etchants are currently preferred as they provide rounded bottom surfaces. The following fluorine-based gas etchants may be used: $SF_6$ sulfur (hexafluoride), $SF_6$ plus an inert gas (e.g., a noble gas), $SF_6$ plus oxygen and one or more inert gases (e.g., He and Ar), and $SF_6$ plus hydrogen bromide (HBr) and one or more inert gases (e.g., He and Ar). In addition, other fluorinated chemistries such as $C_2F_6$, $C_4F_8$, $NF_3$, etc. may be used, along with the above-identified inert gasses ($O_2$, HBr, etc.). The fluorine etches the silicon substrate, while oxygen and HBr form byproducts on the trench sidewalls that minimize the etching of the sidewalls by the fluorine (thereby providing an anisotropic characteristic to the etching processing). Exemplary etching processes may be found in U.S. Pat. No. 6,680,232 to Grebs, et al., which is incorporated herein by reference, and which is commonly assigned herewith. The oxide hard mask may be then removed with a buffered oxide etchant. The top surface of the substrate and the trenches may be cleaned with a soft plasma etch (e.g., $CF_4$ downstream microwave plasma) that may remove about 300 Angstroms of material, followed by a cleaning with a conventional $H_2SO_4/H_2O_2$ etch followed by an RCA SC-1 standard cleaning etch. The soft plasma etch removes any damage caused to the crystalline structure of semiconductor material caused by the previous plasma etch. The etching properties of the soft plasma etch are more isotropic that the prior etch, and is preferably more isotropic than anisotropic. In addition, the soft plasma etch has a lower energy impact on the semiconductor material than the initial plasma etch.

While the above etching of the trenches is illustrated using a patterned oxide layer as the etch mask, it may be appreciate that the etching of the trenches may be done using a patterned photoresist layer as the etch mask. It may also be appreciated that first etchant used to define the initial forms of the trenches may comprises a chorine-based gas instead of a fluorine-based gas.

Figure 6:
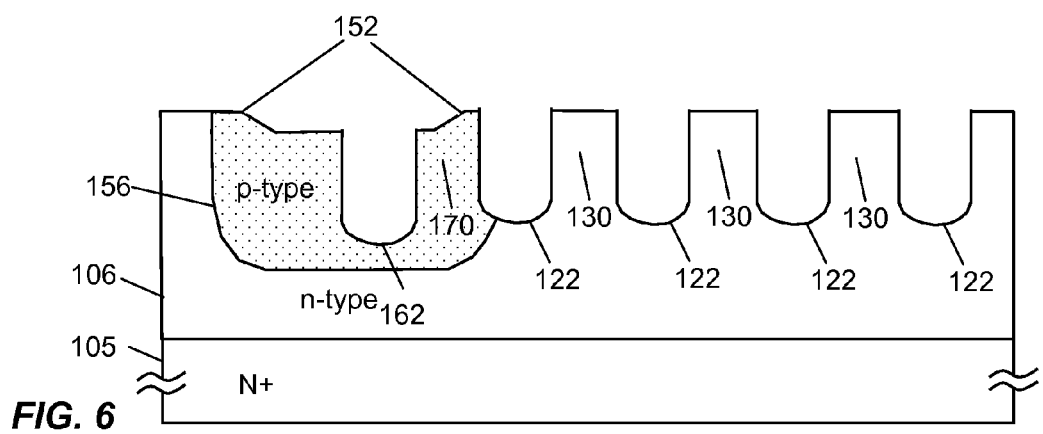

To further round the bottoms of the trenches, a thin sacrificial oxide of about 400 Angstroms may be grown on the sidewalls of the trenches at a temperature of about 1100° C. or higher, and subsequently removed by a brief exposure (approximately 30 seconds) to a buffered oxide etchant. The sacrificial oxide may have a thickness of 1000 Angstroms or less. The sacrificial oxide also ties up dangling silicon bonds on the trench sidewalls caused by the previous plasma etching processes, and also improves the quality of the trench dielectric layers 123, 163, and 167 that will be formed later. A second sacrificial oxide may be grown and removed to provide further rounding of the bottom surfaces of the trenches. After the one or more sacrificial oxides have been grown and removed, the top surface of the substrate and the trenches may be cleaned with a conventional $H_2SO_4/H_2O_2$ etch followed by an RCA SC-1 standard cleaning etch. The result of these processes is shown in FIG. 6.

At block 188 (FIG. 4), the trench dielectric layers 123, 163, and 167 may be formed. This action may comprise growing a thin oxide layer on the trench sidewalls at a high temperature of 1100° C. or more in a dry oxygen environment (no water vapor) that is diluted with an inert gas. The oxide layer, which is also referred to herein as the "shield oxide layer," may be grown to a thickness in the range of about 400 Angstroms to 600 Angstroms, with a thickness of about 500 Angstroms being preferred. Since the mesa tops are exposed during the growth process, the shield oxide layer is also formed over the mesa tops. In one typical implementation, the growth temperature is in the range of 1125° C. to 1200° C., with a value of about 1175° C. (±10° C.) being preferred, and the environment comprises 50% oxygen and 50% argon (e.g., flow rate of each gas of 10 liters per minute). The combined use of the high growth temperature and diluted dry oxygen environment to grow the shield oxide layer is unusual in the power semiconductor art, but the inventors have found that this combination provides fewer pinhole defects in the layer leading to improved gate oxide quality, higher values of $Q_{bd}$ (charge to breakdown), and a better thickness uniformity. The oxygen may be diluted such that it composes 10% to 75% by volume of the gaseous growth environment, and more preferably 25% to 60% by volume of the gaseous growth environment. By the end of this processing, the trenches may have widths of about 0.5 microns and depths of about 1.1 microns, and the mesas may have widths of about 0.3 microns for a typical implementation of device 100.

At block 190 (FIG. 4), the shield electrodes 124, 164, and 168 may be formed. This action may comprise depositing a layer of polysilicon material over the previously formed shield oxide layer, which was in turn formed over the top surface of the substrate (mesa tops) and sidewalls of the trenches. The deposition may be done by conventional polysilicon deposition equipment known to the art. To fill the trench areas with polysilicon material at a trench width of about 0.5 microns and a trench depth of 1.1 microns, the polysilicon material may be deposited to a thickness of 5000 Angstroms (0.5 microns), as measured at the substrate's top surface, at a temperature of 560° C. This amount of material is sufficient to coat the sidewalls of the trenches and fill them in. In general, to prevent voids from occurring in the shield electrode, the polysilicon (or other shield material) should be deposited at a thickness that ranges from one-half of the width of the trench being filled to twice the width. Typically, the deposited thickness is equal to the width of the trench. The polysilicon may be deposited in doped form or un-doped form. If deposited in doped form, it is preferably doped in situ during deposition, and has a doping level of $1\times10^{18}$ dopant atoms per cubic centimeter ($cm^{-3}$) or higher, and more preferably a doping level of $5\times10^{18}$ $cm^{-3}$ or higher. In situ doping may be accomplished by introducing a dopant-containing gas (e.g., phosphine for n-type, and dirborane or boron trifluoride for p-type) along with the gases used to form the polysilicon (e.g., silane and ammonia). If deposited in un-doped form, the polysilicon may be vapor-phase exposed to a dopant gas during a subsequent anneal stage (described below), or may be implanted with dopant at a dose of $5\times10^{15}$ dopant atoms per square centimeter ($cm^{-2}$) at an implant energy of 30 KeV prior to anneal. The dopant dose may be in the range of $5\times10^{14}$ $cm^{-2}$ to $5\times10^{16}$ $cm^{-1}$. A more uniform dopant distribution can be obtained by implanting the dose at two or more implantation energies. For example, a first implantation at a dose of $2.5\times10^{15}$ at 120 KeV and a second implantation at a dose of $2.5\times10^{15}$ at 30 KeV may be used. As another example, four implantations at 10 KeV, 50 KeV, 80 KeV, and 120 KeV, each at a dose of $1.25\times10^{15}$, may be used. The multiple implantations provide more uniform distribution of the dopant in the trench electrode, particularly after anneal. High levels of dopant at the top of the trenches ensures good conductive contact to contact layer 112 (shown in FIGS. 1 and 3), and high levels of the dopant at the bottom of the trenches ensures good shielding action.

The dopant for the polysilicon may be n-type or p-type. N-type dopant is conventionally used in the art, and p-type dopant is not used in the art. However, the inventors have found that p-type doping for the shield electrodes provides a better work function value for the material, which in turn provides better shielding of mesas 130 (shown in FIG. 1). For these reasons, p-type doping for the shield electrodes is currently preferred.

Figure 7:
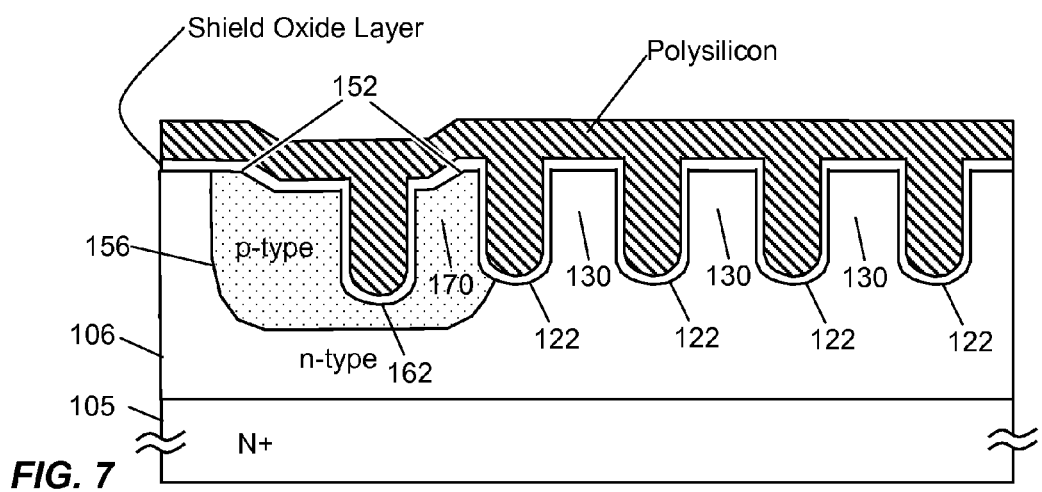
Figure 8:
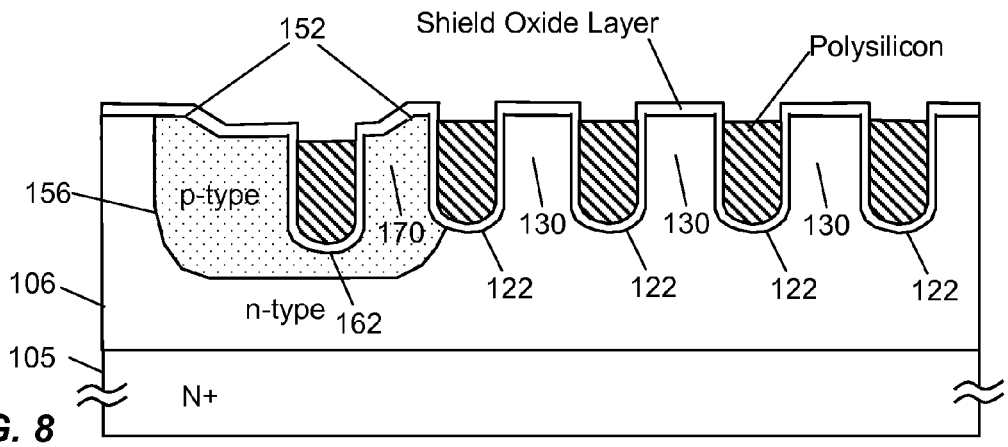

After the polysilicon has been deposited and optionally implanted, it may be annealed at a temperature of 800° C. or more for a sufficient time to consolidate the polysilicon grains and to redistribute the implanted doping (if used). An anneal temperature of 950° C. may be used. If the polysilicon is to be vapor-phase doped during anneal, then the anneal temperature may be raised to 1000° C. or more. Any oxide that forms over the polysilicon during the anneal process may be removed by a brief exposure to a buffered oxide etch, and the substrate may be cleaned with a conventional $H_2SO_4/H_2O_2$ etch followed by an RCA SC-1 standard cleaning etch. The result of these processes is shown in FIG. 7. At this point, a layer of polysilicon on top of a layer of thin oxide is left on the tops of the mesas. A conventional polysilicon etch may then be performed to etch back the polysilicon that is left on the tops of the mesas, with the shield oxide layer acting as an etch stop. This etches off the top portion of the polysilicon layer over both the mesas and the trenches. The polysilicon etch may continue a small duration more to provide a slight etch back of the polysilicon in the trenches so that the top level of the shield electrodes lies below the tops of the mesas. After the polysilicon etch, the substrate may be cleaned with a conventional $H_2SO_4/H_2O_2$ etch followed by an RCA SC-1 standard cleaning etch. The result of these processes is shown in FIG. 8.

At this point, dielectric field layer 158, contact layer 112, and first and second layers 104 and 110 remain to be manufactured by respective processes, most of which generally require exposures to elevated temperatures. In addition, for many applications, the forward-bias electrical characteristics of the Schottky diode are typically adjusted with a shallow implant at the top surfaces of mesas 130 followed by an exposure to elevated temperature to anneal the implant and distribute the implanted dose to desired degree. This optional implant may be done now or following some of processes for forming the remaining elements, depending upon the processing temperatures and times needed to form the remaining elements, and upon the anneal temperature and time needed for the particular implant. In one implementation of this exemplary method, a p-type boron implant is performed at this stage at a dose level of $5\times10^{12}$ $cm^{-2}$ and an implant energy of 40 KeV, which is sufficient to transport a sufficient amount of dopant through the shield oxide layer that is disposed over the top surfaces of the mesas. The processing temperatures and times of the remaining steps are used to anneal the implant and distribute the dopant. This implant dose is best for breakdown voltages of 50V or less, and is sufficiently low as to not to form a junction in the mesa region. The implant dose may change for higher or lower breakdown voltages.

Figure 9:
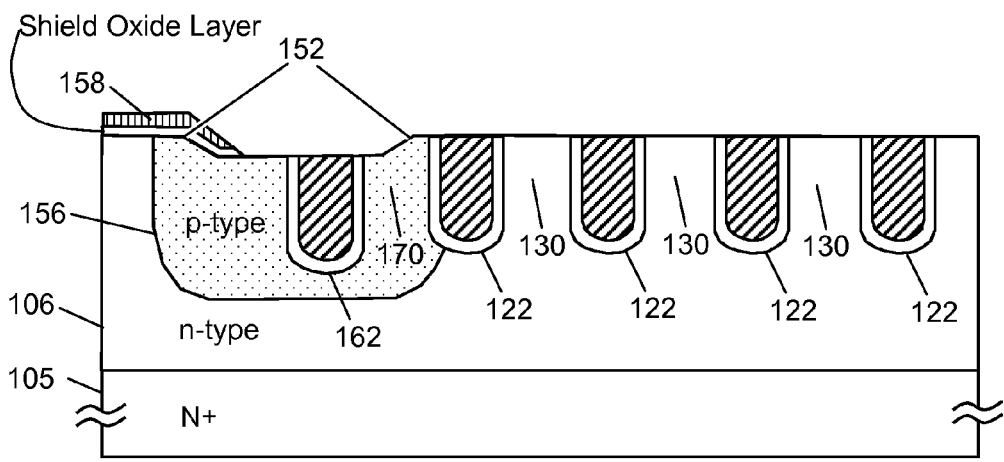

At block 192 (FIG. 4), dielectric field layer 158 may be formed. This action may comprise depositing 5000 Angstroms of a low temperature oxide (LTO), followed by reflowing the LTO layer at about 875° C. in a steam environment. The LTO layer may be deposited with a thickness that ranges from 2500 Angstroms to 10,000 Angstroms. In some implementations, Borophosphosilicate glass (BPSG) may be used, but care should be taken to account for any auto-doping effects between the BPSG layer and the semiconductor mesas 130 (that is, the doping in the BPSG layer may be incorporated into the ambient during subsequent furnace drives and re-deposit onto the exposed surface of the semiconductor mesas; diffusion of such deposited doping into the mesas should be accounted for in the design of the device). Thereafter, the LTO layers may be pattern etched to define their shapes, and to open a deposition window for contact layer 112. This action may comprise forming a photoresist layer over the LTO layer, exposing the photoresist to a pattern of actinic radiation so that the portions of the photoresist that overlay the locations of recess 152 and the central portion of the die can be removed, developing the exposed photoresist to remove those portions to leave exposed portions of the LTO layer. The exposed portions may then be removed by a plasma etch that removes 90% to 95% of the LTO layers, followed by a buffered oxide etch to remove the remaining layers and the underlying shield oxide layer on the top of the mesas. After this etching process, the photoresist layer may be removed, and the substrate may be cleaned with a conventional $H_2SO_4/H_2O_2$ etch followed by an RCA SC-1 standard cleaning etch. The result of these processes is shown in FIG. 9.

At this point, if desired, the above optional implant for adjusting the forward-bias characteristics of the Schottky barrier diode may be performed, followed by an anneal process.

Figure 10:
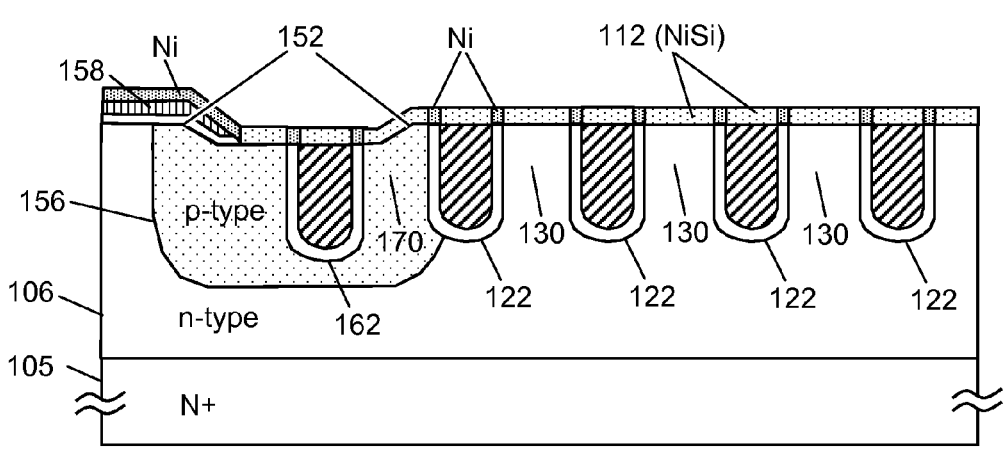

At block 194 (FIG. 4), contact layer 162 may be formed. This action may comprise forming a nickel silicide layer, or other silicide layer, on the exposed tops of the mesas and the shield electrodes. An exemplary process for this may comprise exposing the exposed tops of the mesas and the shield electrodes to a hydrofluoric (HF) etchant for a brief time duration to remove any oxide that has formed, evaporating about 1000 Angstroms of nickel (Ni) on the surface of the substrate, performing a first anneal of the nickel layer at a temperature in the range of 250° C. to 400° C. for about five minutes, and performing a second anneal at a temperature in the range of 400° C. to 700° C. for about five minutes. The first anneal process converts a substantial portion the nickel layer to $Ni_2Si$, and the second anneal process coverts the $Ni_2Si$ to NiSi. In one implementation, the first anneal temperature is at about 350° C. (10° C.), and the second anneal temperature is at about 500° C. (±25° C.). The annealing process coverts about 1000 Angstroms of the tops of the mesas from silicon to nickel silicide, and forms Schottky barriers at the top surfaces of the mesas. The annealing process also converts a portion of the tops of the polysilicon shield electrodes, and forms conductive contacts with the shield electrodes due to the high level of doping in shield electrodes. The result of these processes is shown in FIG. 10. The nickel that is deposited over the silicon oxide is not converted to silicide, and may be etched away with a conventional nickel etchant. The aforementioned nickel layer may be deposited with a thickness that ranges from 200 Angstroms to 2000 Angstroms.

At block 196 (FIG. 4), the first and second layers 104 and 110, or terminal layers, may be formed. This action may comprise depositing one or more electrically conductive layers over each surface of the substrate. Each deposited conductive layer may comprise aluminum, an aluminum alloy such as aluminum silicon (AlSi, with Si at around 1%) and aluminum-silicon-copper Al/SiCu (1% Si and 0.5% Cu), copper, and barrier materials such as titanium (Ti), titanium-tungsten (TiW) as an alloy or as two separate layers, titanium nitride (TiN), tungsten (W), tantalum (Ta), tantalum nitride (TaN), etc. A barrier material may be disposed between the nickel silicide and a thick metal layer (such as one comprising aluminum and/or copper) to improve the adhesion of the metal layer to the nickel silicide, to reduce the chances of spikes of the metal layer penetrating through the silicide layer, to prevent migrating top metal from changing the work function of the nickel silicide. However, a barrier layer is not required. The layers may be deposited by a suitable physical vapor deposition method known in the art. The thickness of one or more deposited layer on each surface may range from 0.1 microns to 10 microns, with 2.5 microns being typical. The result of these processes is shown in FIG. 1.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Optical Proximity Correction Invention. As mentioned above, an optical-proximity-correction (OPC) photolithographic invention according to the present application may be used to readily achieve sub-micron trench widths and mesa widths within recess 152. In addition, the OPC invention provides for substantially uniform widths in the mesas and the trenches as they move from the central area of the die to recess 152. This is important, since the inventors have found that variations in the mesa widths lead to an undesirable difference in the breakdown voltages of the central area (i.e., the active region of the device) and the area of recess 152 (i.e., the termination region). Typically, a narrowing of the mesa width in the termination region may cause the termination region to have a lower breakdown voltage relative to the active region. On the other hand, if the mesa width is too wide, then lower shielding of the device area at the top of the mesa could occur, leading to higher reverse-bias leakage current and/or lower breakdown voltage. The OPC invention is described after some background information about photomasks and photoresist layers is provided.

To decrease costs and increase throughput, several semiconductor die are manufactured together on a semiconductor wafer, and separated from the wafer after manufacturing. In the beginning part of the semiconductor industry, each photomask used in a manufacturing process contained the patterns for all the dice on the wafer, with each photomask having alignment marks located at its outer edges that were aligned to alignment marks made in wafer during the initial manufacturing stage. However, due to natural warpage of the wafer and to thermal expansion effects during manufacturing, this approach limited the minimum feature sizes that could be achieved.

Today, the majority of photomasks used in the semiconductor industry are in the form of reticles, where a reticle provides the imaging patterns for a small number of the semiconductor dice on the wafer for one processing stage. The maximum size of the reticle is typically limited to an area of 2.5 mm by 2.5 mm by the lithographic equipment. A manufacturer typically fits as many dice and die streets as possible within this maximum area, and then trims the dimensions of the reticle to fit a whole number of dice and die streets in each reticle dimension. (As is known in the art, a die street is a strip of unused wafer space that boarders adjacent dice, and is the area that is sawed away in order to removed the dice from the wafer after manufacturing.) However, in order to achieve better feature resolution, a manufacturer may choose to only put one die and two die streets in a reticle, or only a few dice and corresponding die streets in the reticle, and not fully use the maximum reticle size. Regardless of the number dice, we will refer to the dice covered by a reticle as the "die group." During a particular photo exposure process, the photomask reticle is stepped over the wafer to individually expose the site of each die group on the wafer by a stepper or a stepper-scanner (which are pieces of lithographic equipment). The reticle is mounted in the stepper or stepper-scanner, and the wafer is roughly aligned to the stepper or stepper-scanner, which roughly aligns the wafer to the reticle. Then, the stepper or stepper-scanner precisely aligns the reticle to each die-group site on the wafer just before each die-group site is exposed to actinic radiation passed through the reticle. The reticle is typically provided with two or more alignment marks that are to be aligned to respective alignment marks on the wafer or die-group site, and the scanner or stepper may adjust the position of the wafer with respect to the reticle to provide the best overall fit of the reticle's alignment marks to the corresponding marks on the die-group site. The alignment marks may be part of the patterns forming the components of some of the dice in a die group (e.g., peripheries of some of the power devices), or may be separate. Typically, the alignment marks are placed in the die streets adjacent to the two or more of the outer most dice in the die group, or placed in the die streets adjacent to each die of the die group. Without loss of generality, this invention will be illustrated with the alignment marks placed in the die streets. These alignment marks may take any form known to the art, and will be denoted herein as cross-marks for visual simplicity. However, it should be understood that the alignments marks recited in the description and the claims cover all known and possible alignment marks. In whichever form the alignment marks take, the spacing distances between them are on the order of dimensions of the reticle, not of the wafer, which greatly minimizes the thermal expansion and warpage effects that previously limited minimum feature sizes.

While photoresists come in a wide variety of chemical formulations, they may be categorized into two basic groups: so called "positive-tone" photoresists and "negative-tone" photoresists. When a portion of a positive-tone photoresist is exposed to actinic radiation, it can be removed from the semiconductor wafer by a developer solution. A threshold amount of dosage to actinic radiation is needed to enable the removal of the exposed photoresist, where dosage is the time integrated amount of the radiation's intensity. A portion of the positive-tone photoresist that is not exposed to actinic radiation above the threshold amount cannot be removed by the developer, and remains on the wafer. The photomask for a positive photoresist therefore has transmissive regions to define the locations of the photoresist that are to be removed by the developer solution, and opaque regions to define the locations of the photoresist that are to remain on the wafer. Conversely, when a portion of a negative-tone photoresist is exposed to actinic radiation above a threshold dosage amount, it cannot be removed from the semiconductor wafer by a developer solution, and it remains on the wafer. However, a portion of the negative-tone photoresist that is not exposed to actinic radiation above the threshold dosage amount can be removed by the developer. The photomask for a negative photoresist therefore has transmissive regions to define the locations of the photoresist that are to remain, and opaque regions to define the locations of the photoresist that are to be removed by the developer solution. Thus, to form the same image in a wafer, a photomask for a negative-tone photoresist would substantially comprise the negative image of the photomask for a positive-tone photoresist.

While positive-tone photoresists are more commonly used today, the optical-proximity-correction invention of the present application may be used with either positive-tone or negative-tone photoresists. To encompass both types of photoresists, the description and claims herein state that a mask has regions for defining corresponding regions in the photoresist, where it is understood that the opacity (e.g., transparent or opaque) of the mask's regions is selected based upon the tone of the photoresist to provide the definition of the stated regions in the photoresist. To complete this discussion, we note that once a photoresist has been patterned, developed, and used for its intended masking purpose, it may be removed by a suitable solvent or etchant (e.g., plasma etch), regardless of its tone.

Figure 11:
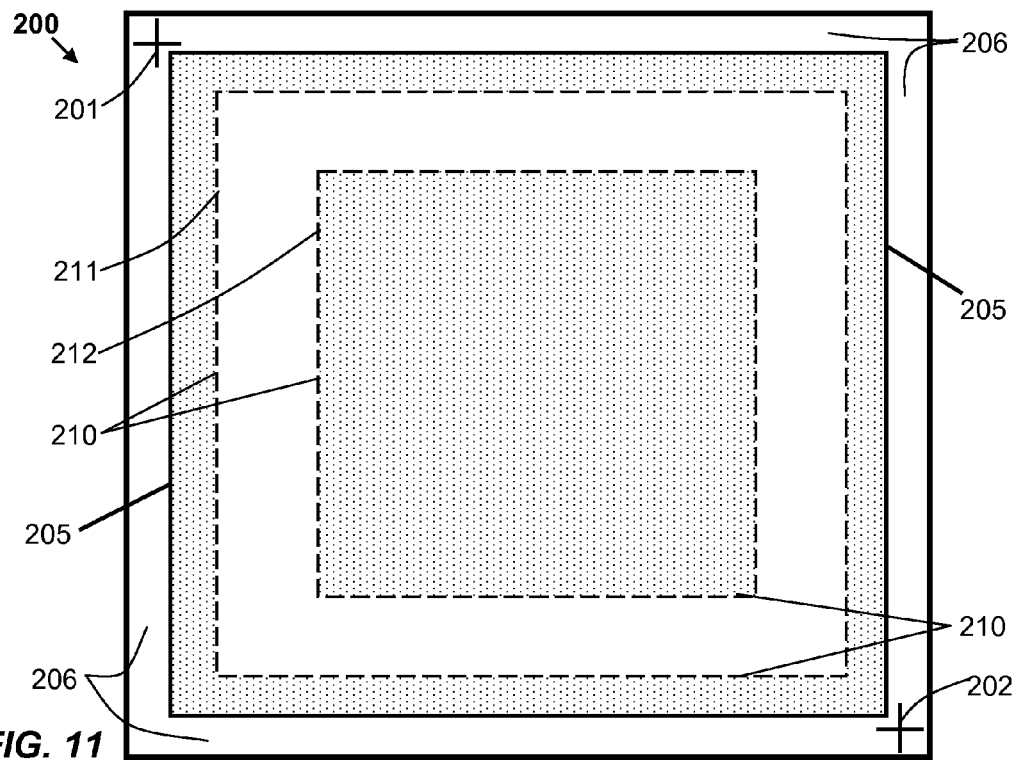
FIGS. 11-13 show top plan views of exemplary photomasks for defining features in a semiconductor wafer according to another invention of the present application.

FIG. 11 shows a top plan view of an exemplary photomask 200, in reticle form, for defining recess 152 in semiconductor device 100. For the sake of visual clarity, and without loss of generality, the photomasks shown and described herein have a die group with a single die, and adjacent die streets surrounding the single die, with the die streets being half their normal widths. In each of the photomasks shown herein, the area of the die is indicated by reference number 205, and the die streets are indicated by reference number 206. Photomask 200 comprises a region 210 for defining recess 152. Region 210 comprises the shape of a rectangular ring, with an outer peripheral edge 211 and an inner peripheral edge 212. Since recess 152 is formed by etching, the opacity of region 210 is selected based on the tone of the photoresist layer to removed the photoresist in locations where recess 152 is to be formed. Thus, region 210 is transmissive for a positive-tone photoresist, and opaque for a negative-tone photoresist. The outer peripheral edge 211 or the inner peripheral edge 212 of region 210, and the corresponding peripheral edges of recess 152, may be used to align subsequent masks. For example, the corners of each outer peripheral edge provide inherent alignment marks that can be used for subsequent photomasks. Without loss of generality, two alignment marks 201 and 202, which are located in die streets 206 and at opposite diagonal corners of die area 205, are used. After photo-exposure and etching, these alignment marks leave corresponding alignment marks in the surface of the wafer, to which alignment marks of subsequent photomasks can be aligned. Also after photo-exposure and etching, the following are formed at the first surface of the wafer: a first area (e.g., recess 152 shown in FIG. 1) of a first height, a second area of a second height adjacent to the first area (which includes active area 120 shown in FIG. 1), and a peripheral edge between the first and second areas. For device 100 (shown in FIG. 1), the first height is below the second height. (Below, an example in which the first height is above the second height is provided.)

Figure 12:
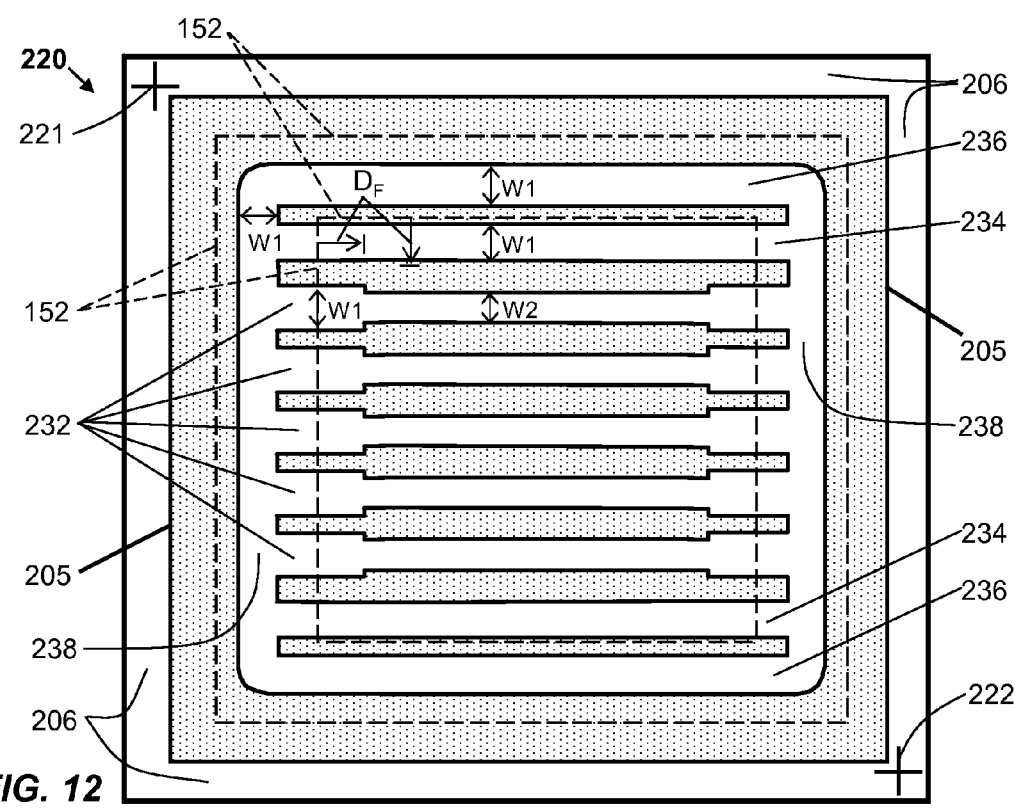

FIG. 12 shows a top plan view of an exemplary photomask 220, in reticle form, for defining trenches 122, 162, and 166 in semiconductor device 100. Photomask 220 has two alignment marks 221 and 222 for aligning to the marks left in the wafer's surface by alignment marks 201 and 202. For reference, the inner and outer peripheral edges of recess 152 are illustrated in the figure by dashed lines. The inner peripheral edge of recess 152 corresponds to the aforementioned peripheral edge between the first and second areas. Alignment marks 221 and 222 substantially coincide with alignment marks 211 and 212 of photomask 200, when photomasks 200 and 220 are aligned to one another. Thus alignment marks 221 and 222 of photomask 220 correspond to alignment marks 211 and 212 of photomask 200. Photomask 220 is suitable for positive-tone photoresists. Photomask 220 comprises an array of first striped regions 232 for defining the central ones of trenches 122 (shown in FIG. 2), two second striped regions 234 for defining the outer ones of trenches 122 (i.e., the ones on the outside sides of the array of trenches 122), two additional second striped regions 236 for defining end trenches 162 (shown in FIG. 2), and two third striped regions 238 for defining end trenches 166 (shown in FIG. 2).

Each of striped regions 232 has a leftmost distal portion that is to be aligned within leftmost portion of recess 152 (the aforementioned first area), a rightmost distal portion that is to be aligned within rightmost portion of recess 152, and a middle portion that is to be aligned outside of the recessed region and within the aforementioned second area. Each distal portion of striped region 232 has a first width W1, and the middle portion has a second width W2 that is different from the first width. For positive-tone photoresists, width W1 is greater than width W2 when the first area of the wafer surface is recessed below the second area of the wafer surface. The inventors have discovered that some defocusing of the actinic radiation occurs in the distal portions of striped regions 232 due to the greater distance between the focal plane of the pattern for recess 152, which causes a decrease in the intensity of the radiation at the edges of the distal portions. When the widths W1 and W2 are made equal, the inventors found that the photoresist layer could not be properly patterned to form trenches 122, with the photoresist material bridging across the trench area corresponding to the distal portions of trenches 122 and of striped regions 232. The inventors also found that if the dosage of the radiation was increased to prevent this bridging effect, then the dimensions of the photoresist for the middle portions (W2) of the trenches became too wide. By making width W1 greater than width W2, the intensity of the actinic radiation is increased at the intended edges of the trench area corresponding to the distal portions of striped regions 232, and the photoresist layer can be properly defined in distal portions of trenches 122 and of striped regions 232. Thus, after the photoresist is exposed and developed to form trenches in the photoresist layer using two different widths W1 and W2 in the photomask, the width of the photoresist trenches patterned with width W1 equals or more closely matches the width of the photoresist trenches patterned with width W2. The trenches in the photoresist layer may then be transferred to the semiconductor wafer by an etching process (described above) with substantially uniform widths in recess 152 and the central area of the die.

The inventors have further discovered that the effects of the defocused actinic radiation in the area of recess 152 creep inward from the inner peripheral edge of recess 152 toward the middle of the trench array by a distance $D_F$, which is illustrated near the top left corner of mask 220. The value of $D_F$ varies due to the optical properties of the stepper and stepper-scanner, the dimensions of the trenches, the thickness of the photoresist, and the properties of the photoresist and the developer. The value of $D_F$ is on the order of one micron, but it is believed that it can vary from zero microns to 10 microns. To counter the effects of defocusing over distance $D_F$, the portions of striped regions 232 that are outside of the area of recess 152 (the aforementioned first area) but within distance $D_F$ of the inner peripheral edge of recess 152 may be made with width W1, as shown in the figure. This may be viewed as each striped region 232 having a third region of width W1 disposed between each distal portion and middle portion of the striped region 232. Each third portion may have a width that is equal to W1, or is equal to a value that is between widths W1 and W2. The width of the third portion is typically closer to W1 than W2. The length of each third portion can be equal to $D_F$, or somewhat smaller or somewhat larger. This distance can vary between zero and ten microns, but typically varies between 0.2 microns and 5 microns, and more typically between 0.5 microns and 2 microns. The width of each third portion may also be tapered from W1 to W2, but such tapering is generally difficult to implement at the sub-micron level of dimensions with present day processing equipment.

The value of W1 and W2 for a particular processing condition can be determined by one of ordinary skill in the art without undue experimentation by manufacturing several test photomasks with several corresponding selections of W1 for a desired value of W2, with the dividing line between widths W1 and W2 being located outside of recess 152 and about one micron away from the inner peripheral edge of recess 152. These test photomasks may then be used on a set of respective test dice that have recesses 152, the quality of the photoresist layers that result from the test photomasks may be viewed, and the die (and its value of W1) that provides the best photoresist resolution in the recess 152 may be selected. The value of $D_F$ may then be estimated from another set of test photomasks that use the selected values of W1 and W2, but vary spacing distance between the dividing lines between widths W1 and W2 and the inner peripheral edge of recess 152. This second set of test photomasks may then be used on a second set of respective test dice that have recesses 152. The quality of the photoresist layers that result from these test photomasks may be viewed, and the die that provides the best photoresist resolution around the inner periphery of the recess 152 may be selected to provide the value of $D_F$ (that is, the spacing distance between widths W1 and W2 and the inner peripheral edge of recess 152 of this best test die provides the estimated value of $D_F$).

Since trenches 162 and 166 (FIG. 2) lie within recess 152 (the aforementioned first area), the widths of second striped regions 236 and third striped regions 238 are closer in value to W1 than W2, and are preferably set at W1. If the outer ones of trenches (i.e., the ones on the outside sides of the array of trenches 122) are within distance $D_F$ of the inner peripheral edge of recess 152, then the widths of second striped regions 234 are preferably set to W1, as shown in FIG. 12. However, the widths of striped regions 234 may have values between W1 and W2, and may have values that are closer to W1 than W2.

Figure 13:
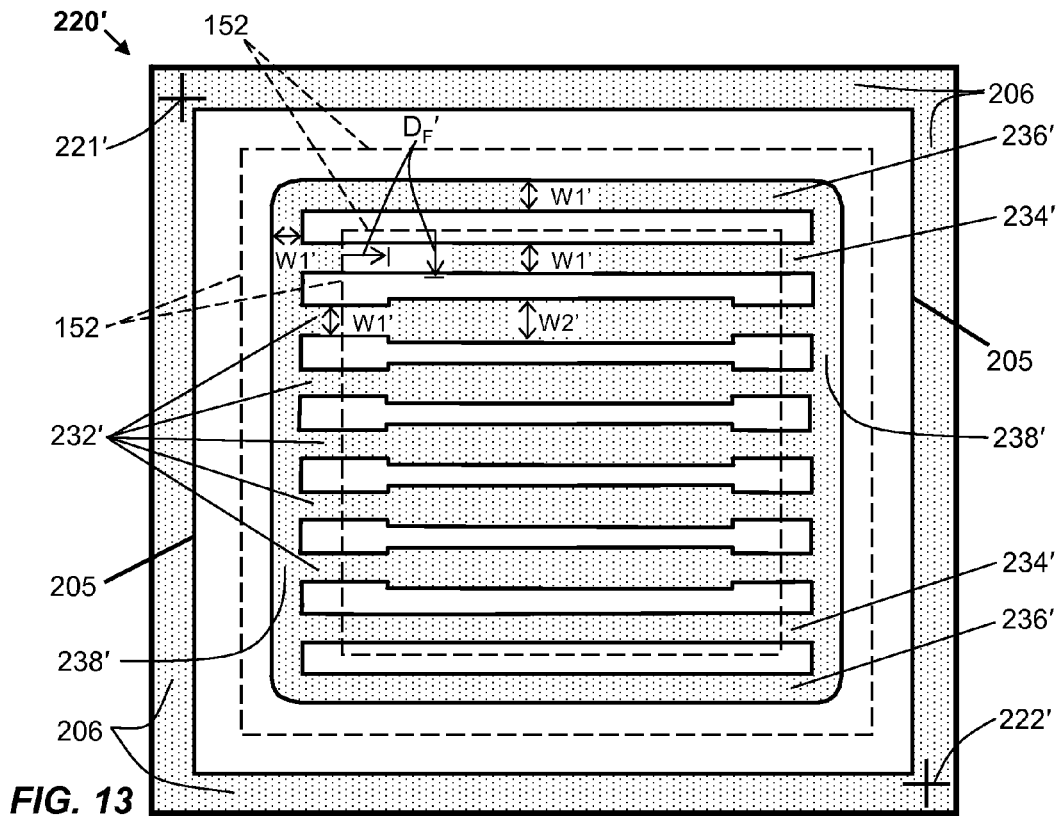

FIG. 13 shows a top plan view of an exemplary photomask 220', in reticle form, for defining trenches 122, 162, and 166 in semiconductor device 100 using a negative-tone photoresist. Photomask 220' has two alignment marks 221' and 222' for aligning to the marks left in the wafer's surface by alignment marks 201 and 202. For reference, the inner and outer peripheral edges of recess 152 are illustrated in the figure by dashed lines. Alignment marks 221' and 222' substantially coincide with alignment marks 211 and 212 of photomask 200, when photomasks 200 and 220' are aligned to one another. Thus alignment marks 221' and 222' of photomask 220' correspond to alignment marks 211 and 212 of photomask 200. Photomask 220' comprises an array of first striped regions 232' for defining the central ones of trenches 122 (shown in FIG. 2), two second striped regions 234' for defining the outer ones of trenches 122 (i.e., the ones on the outside sides of the array of trenches 122), two additional second striped regions 236' for defining end trenches 162 (shown in FIG. 2), and two third striped regions 238' for defining end trenches 166 (shown in FIG. 2). Thus striped regions 232', 234', 236', and 238' of photomask 220' has the same purpose as striped regions 232, 234, 236, and 238 of photomask 220. However, the dimensions of the portions of the striped regions are different.

Each of striped regions 232' has a leftmost distal portion that is to be aligned within leftmost portion of recess 152 (the aforementioned first area), a rightmost distal portion that is to be aligned within rightmost portion of recess 152, and a middle portion that is to be aligned outside of the recessed region in the central area of the die (the aforementioned second area). Each distal portion of striped region 232' has a first width W1', and the middle portion has a second width W2'. When the first area of the wafer surface is recessed below the second area of the wafer surface, second width W2' is greater than width W1'. This relationship is the opposite of relationship between W1 and W2 in photomask 220, and is due to the complementary nature of positive-tone and negative-tone photoresists.

Photomask 220' has distance $D_F'$ that has the same cause and purpose as distance $D_F$ of photomask 220, although it may has a somewhat different value due to the different properties of the negative-tone photoresist. Nonetheless, distance $D_F'$ may have the same ranges as recited above for distance $D_F$. To counter the effects of defocusing over distance $D_F'$, the portions of striped regions 232' that are outside of the area of recess 152 but within distance $D_F'$ of the inner peripheral edge of recess 152 may be made with width W1', as shown in the figure. This may be viewed as each striped region 232' having a third region of width W1' disposed between each distal portion and middle portion of the striped region 232'. Each third portion may have a width that is equal to W1', or is equal to a value that is between widths W1' and W2'. The length of each third portion can be equal to $D_F'$, or somewhat smaller or somewhat larger. This distance can vary between zero and ten microns, but typically varies between 0.2 microns and 5 microns, and more typically between 0.5 microns and 2 microns. The width of each third portion may also be tapered from W1' to W2'. Since trenches 162 and 166 (FIG. 2) lie within recess 152, the widths of second striped regions 236' and third striped regions 238' are preferably set at W1'. If the outer ones of trenches (i.e., the ones on the outside sides of the array of trenches 122) are within distance $D_F'$ of the inner peripheral edge of recess 152, then the widths of second striped regions 234' are preferably set to W1', as shown in FIG. 13. However, the widths of striped regions 234', 236', and 238' may have values between W1 and W2, and may have values that are closer to W1 than W2.

The values of W1', W2', and $D_F'$ of photomask 220' may be estimated by the same experimental methods as described above for W1, W2, and $D_F$ of photomask 220. Photomask 220' is also suitable for so called "negative acting" positive-tone photoresists, which are exposed as if they are negative-tone photoresist, but are post-exposure treated to be developed as positive tone images by the developer.

Figure 14:
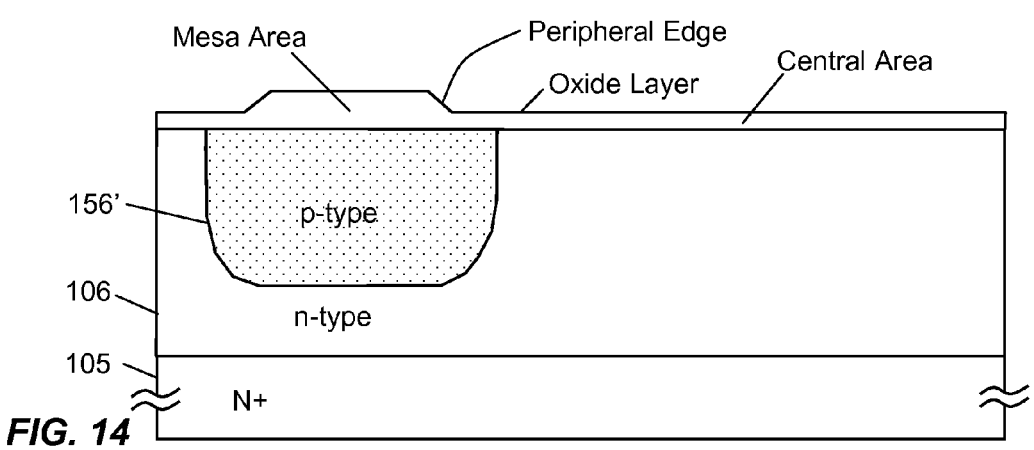
FIG. 14 shows a partial cross section view of an exemplary trench-shielded power semiconductor device prior to trench formation according to an invention of the present application.
Figure 15:
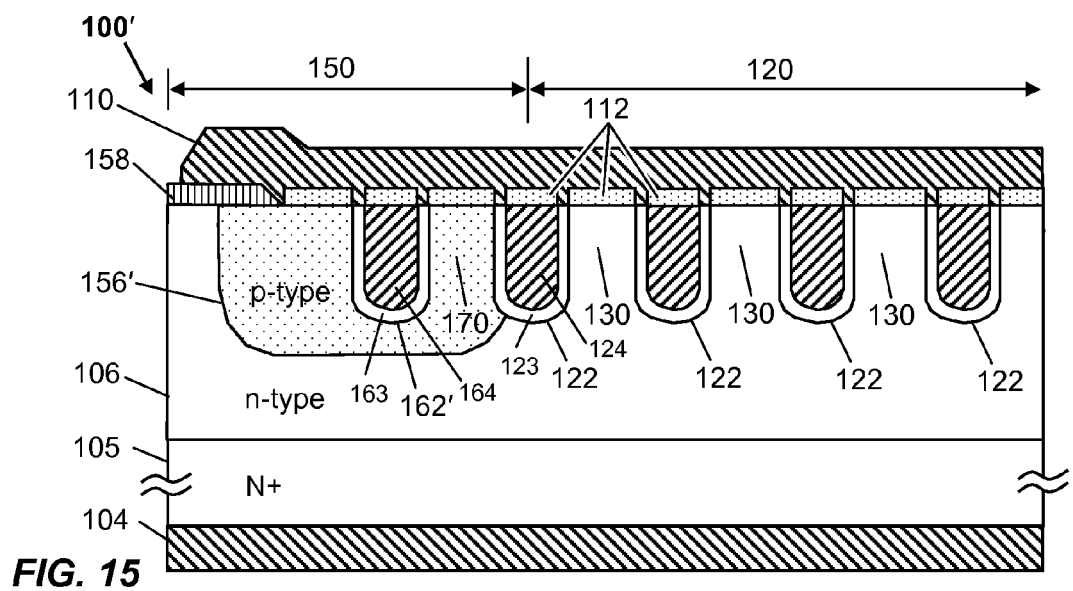
FIG. 15 shows a partial cross section view of another exemplary trench-shielded power semiconductor device according to an invention of the present application.

The optical proximity correction invention of the present application may be applied to other device configurations in which a mesa region is located in the first area instead of recess 152. Such an instance is shown in the cross section of FIG. 14 of a device die prior to the formation of the trenches. The completed device is shown at 100' in FIG. 15. The device die does not have a recess 152, and has a p-doped isolation well 156' with a top surface that may be substantially flush with the top surface of semiconductor layer 106. An end trench 162' is disposed in p-doped isolation well 156'. Referring back to FIG. 14, prior to forming the trenches, an oxide layer is disposed over the top surfaces of well 156' and semiconductor layer 106, with the oxide layer having a raised area over well 156'. This structure may result from using a patterned layer of p-doped BPSG glass to provide the doping for well 156'. After being deposited, the BPSG layer may be etched through a photoresist layer that was patterned by mask 200 shown in FIG. 11. The patterned BPSG layer may be heated to anneal it and to diffuse dopant in the semiconductor layer to form well 156'. During the anneal, steam and/or dry oxygen ambients may be introduced to grow an oxide layer over the central portion of the die. After the anneal, the mesa area of the oxide layer may have a thickness than ranges between 3000 Angstroms to 13,000 Angstroms, and the central area may have a thickness of 1500 Angstroms to 2500 Angstroms (with 2000 Angstroms being typical).

A photoresist layer may then formed over the oxide layer, patterned with actinic radiation through a photomask, and developed to leave photoresist trenches that can be used to etch the oxide layer. The patterned oxide layer may then be used with an etchant to form the in the semiconductor surface. With the central area lower than the mesa area, the aforementioned defocusing effects in the photoresist occur in the central area rather than the peripheral area (e.g., area of recess 152 for device 100 shown in FIG. 1). According, the previous relationship between W1 and W2 of the photomask is reversed. That is, for positive-tone photoresists, width W1 is less than width W2 in this case where the mesa area (e.g., the aforementioned first area of the wafer surface) is above the central area (e.g., the aforementioned second area of the wafer surface). Accordingly, a photomask having the reverse image of photomask 220' may be use to pattern the positive-tone photoresist. For negative-tone photoresists, width W1 is greater than width W2 in this case, and a photomask having the reverse image of photomask 220 may be use to pattern the negative-tone photoresist.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

While the various embodiments of some of the inventions are mostly described in the context of N-channel trench shielded devices, embodiments according to these inventions may be implemented as P-channel trench-shielded devices where the conductivity types of the layers and regions are reversed. Moreover, while some the embodiments of some of the inventions have been illustrated using Schottky barrier rectifiers, embodiments according to such inventions may be implemented with MOSFET structures, IGBT structures, BJT structures, shielded gate synchronous rectifiers (e.g., integrated shielded gate MOSFET and Schottky), and super-junction variations of the devices described herein (e.g., devices with columns of alternating conductivity type silicon).

Moreover, one or more features of one or more embodiments of the inventions may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure (e.g., various changes may be made and equivalents may be substituted for elements thereof to adapt to particular situations), and are intended to be within the scope of the invention and the appended claims.

What is claimed is:

1. A semiconductor device comprising:
   a semiconductor region having a surface;
   a first area of the semiconductor region;
   a well region of a first conductivity type disposed in the semiconductor region and around the first area, the semiconductor region having a second conductivity type that is opposite to the first conductivity type, the well region having a bottom surface disposed below the surface of the semiconductor region; and
   a plurality of trenches extending in a semiconductor region, each trench having a first end disposed in a first portion of the well region and above the bottom surface of the well region, a second end disposed in a second portion of the well region and above the bottom surface of the well region, and a middle portion between the first and second ends and disposed in the first area, each trench further having opposing sidewalls lined with a dielectric layer, and a conductive electrode disposed on at least a portion of the dielectric layer.

2. The semiconductor device of claim 1, wherein at least a portion of the well region has a surface that is recessed below the surface of the semiconductor region, and wherein the bottoms of the first and second end portions of each trench lies below the bottom of the middle portion of the trench.

3. The semiconductor device of claim 1, wherein the trenches are disposed parallel to one another.

4. The semiconductor device of claim 3, further comprising a first end trench disposed in the well region, the first end trench having a first end, a second end, opposing sidewalls lined with a dielectric layer, and a conductive electrode disposed on at least a portion of the dielectric layer, the first end trench being further disposed to one side of the plurality of trenches and parallel to the plurality of trenches.

5. The semiconductor device of claim 4, wherein the first end trench has a width that is in the range of 0.8 times to 1.2 times the width of a trench of the plurality of trenches.

6. The semiconductor device of claim 4, further comprising a first mesa disposed between two adjacent trenches of the plurality of trenches, and a second mesa disposed between the first end trench and the plurality of trenches, wherein the second mesa has a width that is in the range of 0.8 times to 1.2 times the width of a trench of the first mesa.

7. The semiconductor device of claim 4, further comprising a second end trench disposed in the well region, the second end trench having a first end, a second end, opposing sidewalls lined with a dielectric layer, and a conductive electrode disposed on at least a portion of the dielectric layer, the second end trench being further disposed perpendicular to the first ends of the plurality of trenches.

8. The semiconductor device of claim 7, wherein the first ends of the first and second end trenches are joined together.

9. The semiconductor device of claim 8, wherein at least a portion of the well region has a surface that is recessed below the surface of the semiconductor region, and wherein the bottoms of the first and second end portions of each trench lies below the bottom of the middle portion of the trench, and wherein the bottoms of the first and second end trenches lie below the bottom of the middle portion of at least one of the other trenches.

10. The semiconductor device of claim 3, further comprising an end trench disposed in the well region, the end trench having a first end, a second end, opposing sidewalls lined with a dielectric layer, and a conductive electrode disposed on at least a portion of the dielectric layer, the end trench being further disposed perpendicular to the first ends of the plurality of trenches.

11. The semiconductor device of claim 1, further comprising a perimeter trench disposed in the well region and encircling the plurality of trenches.

12. The semiconductor device of claim 1, further comprising an active region of a second conductivity type opposite to the first conductivity type disposed in the semiconductor region and within the first area thereof.

13. The semiconductor device of claim 1, wherein the well region has a surface that is flush with the surface of the semiconductor region.

14. A semiconductor device comprising:
a semiconductor region having a surface; and
a plurality of trenches extending in a semiconductor region, each trench having a first end, a second end, and a middle portion between the first and second ends, each trench further having opposing sidewalls lined with a dielectric layer, and a conductive electrode disposed on at least a portion of the dielectric layer, wherein the conductive electrode comprises p-doped polysilicon, wherein at least a portion of the p-doped polysilicon has a net doping level of $1\times10^{18}$ dopant atoms per cubic centimeter ($cm^{-3}$) or higher.

15. A method of manufacturing a semiconductor device with one or more trenches, the method comprising:
forming one or more trenches extending into a semiconductor region, the semiconductor region having a surface, each trench having a first end, a second end, and a middle portion between the first and second ends, each trench further having a bottom wall opposing side walls, the one or more trenches defining surfaces of the semiconductor region that are adjacent to the one or more trenches;
forming a dielectric layer on the side and bottom walls of the one or more trenches; and
filling the one or more trenches with p-doped polysilicon material to provide conductive electrodes, wherein the p-doped polysilicon material is disposed on at least a portion of the dielectric material of each trench, wherein at least a portion of the p-doped polysilicon has a net doping level of $1\times10^{18}$ dopant atoms per cubic centimeter ($cm^{-3}$) or higher.

16. The method of claim 15, wherein forming the dielectric layer forms the layer on the surfaces of the semiconductor region that are adjacent to the one or more trenches; and wherein filling the one or more trenches with p-doped polysilicon material comprises:
depositing a layer of p-doped polysilicon material over the dielectric layer;
annealing the deposited polysilicon material; and
removing a top portion of the annealed polysilicon material.

17. The method of claim 16, wherein the polysilicon material is deposited at a first temperature, and wherein annealing the deposited polysilicon material comprises heating the deposited polysilicon layer to a second temperature that is greater than the first temperature.

18. The method of claim 15, wherein filling the one or more trenches with p-doped polysilicon material comprises:
depositing a layer of polysilicon material over the dielectric layer and semiconductor region;
implanting a p-type dopant into the polysilicon material;
annealing the implanted polysilicon material; and
removing a top portion of the annealed polysilicon material.

19. The method of claim 18, wherein implanting a p-type dopant comprises implanting the dopant at two or more implant energy levels.

20. The method of claim 18 wherein the implanted dose of the p-type dopant is at least $5\times10^{14}$ dopant atoms per square centimeter.

21. The method of claim 18 wherein the implanted dose of the p-type dopant is in the range of $5\times10^{14}$ dopant atoms per square centimeter to $5\times10^{16}$ dopant atoms per square centimeter.

22. The method of claim 15, wherein forming the dielectric layer forms the layer on the surfaces of the semiconductor region that are adjacent to the one or more trenches; and wherein filling the one or more trenches with p-doped polysilicon material comprises:
depositing a layer of polysilicon material over the dielectric layer;

annealing the polysilicon material while exposing the polysilicon material to a vapor-phase p-type dopant; and removing a top portion of the annealed polysilicon material.

23. A semiconductor device comprising:
a semiconductor region having a surface;
a first area of the semiconductor region;
a well region of a first conductivity type disposed in the semiconductor region and around the first area; and
a plurality of trenches extending in a semiconductor region and disposed parallel to one another, each trench having a first end disposed in a first portion of the well region, a second end disposed in a second portion of the well region, and a middle portion between the first and second ends and disposed in the first area, each trench further having opposing sidewalls lined with a dielectric layer, and a conductive electrode disposed on at least a portion of the dielectric layer;
a first end trench disposed in the well region, the first end trench having a first end, a second end, opposing sidewalls lined with a dielectric layer, and a conductive electrode disposed on at least a portion of the dielectric layer, the first end trench being further disposed to one side of the plurality of trenches and parallel to the plurality of trenches; and
a second end trench disposed in the well region, the second end trench having a first end, a second end, opposing sidewalls lined with a dielectric layer, and a conductive electrode disposed on at least a portion of the dielectric layer, the second end trench being further disposed perpendicular to the first ends of the plurality of trenches.

24. The semiconductor device of claim 23, wherein the first ends of the first and second end trenches are joined together.

25. The semiconductor device of claim 24, wherein at least a portion of the well region has a surface that is recessed below the surface of the semiconductor region, and wherein the bottoms of the first and second end portions of each trench lies below the bottom of the middle portion of the trench, and wherein the bottoms of the first and second end trenches lie below the bottom of the middle portion of at least one of the other trenches.

26. A semiconductor device comprising:
a semiconductor region having a surface;
a first area of the semiconductor region;
a well region of a first conductivity type disposed in the semiconductor region and around the first area;
a plurality of trenches extending in a semiconductor region and disposed parallel to one another, each trench having a first end disposed in a first portion of the well region, a second end disposed in a second portion of the well region, and a middle portion between the first and second ends and disposed in the first area, each trench further having opposing sidewalls lined with a dielectric layer, and a conductive electrode disposed on at least a portion of the dielectric layer; and
an end trench disposed in the well region, the end trench having a first end, a second end, opposing sidewalls lined with a dielectric layer, and a conductive electrode disposed on at least a portion of the dielectric layer, the end trench being further disposed perpendicular to the first ends of the plurality of trenches.

27. The semiconductor device of claim 26, wherein at least a portion of the well region has a surface that is recessed below the surface of the semiconductor region, and wherein the bottoms of the first and second end portions of each trench lies below the bottom of the middle portion of the trench.

28. The semiconductor device of claim 26, further comprising an active region of a second conductivity type opposite to the first conductivity type disposed in the semiconductor region and within the first area thereof.

29. The semiconductor device of claim 26, wherein the well region has a surface that is flush with the surface of the semiconductor region.

30. A semiconductor device comprising:
a semiconductor region having a surface;
a first area of the semiconductor region;
a well region of a first conductivity type disposed in the semiconductor region and around the first area;
a plurality of trenches extending in a semiconductor region, each trench having a first end disposed in a first portion of the well region, a second end disposed in a second portion of the well region, and a middle portion between the first and second ends and disposed in the first area, each trench further having opposing sidewalls lined with a dielectric layer, and a conductive electrode disposed on at least a portion of the dielectric layer; and
a perimeter trench disposed in the well region and encircling the plurality of trenches.

31. The semiconductor device of claim 30, wherein at least a portion of the well region has a surface that is recessed below the surface of the semiconductor region, and wherein the bottoms of the first and second end portions of each trench lies below the bottom of the middle portion of the trench.

32. The semiconductor device of claim 30, wherein the trenches are disposed parallel to one another.

33. The semiconductor device of claim 30, further comprising an active region of a second conductivity type opposite to the first conductivity type disposed in the semiconductor region and within the first area thereof.

34. The semiconductor device of claim 30, wherein the well region has a surface that is flush with the surface of the semiconductor region.

* * * * *